(12) United States Patent
Takashima et al.

(10) Patent No.: US 7,936,567 B2
(45) Date of Patent: May 3, 2011

(54) WIRING BOARD WITH BUILT-IN COMPONENT AND METHOD FOR MANUFACTURING THE SAME

(75) Inventors: Tsuneaki Takashima, Higashishin-machi (JP); Jun Otsuka, Aichi (JP); Makoto Origuchi, Aichi (JP); Yukinobu Nagao, Asahi-machi (JP); Chy Narith, Aichi (JP); Kozo Yamasaki, Gifu (JP)

(73) Assignee: NGK Spark Plug Co., Ltd., Aichi (JP)

( * ) Notice: Subject to any disclaimer, the term of this patent is extended or adjusted under 35 U.S.C. 154(b) by 628 days.

(21) Appl. No.: 12/107,971

(22) Filed: Apr. 23, 2008

(65) Prior Publication Data

US 2008/0277150 A1    Nov. 13, 2008

(30) Foreign Application Priority Data

May 7, 2007    (JP) .................................. 2007-122034

(51) Int. Cl.
  *H05K 1/18*    (2006.01)
(52) U.S. Cl. ......... 361/761; 361/763; 361/766; 174/261
(58) Field of Classification Search .......... 361/761–764, 361/766, 767, 760, 746, 795, 738, 782, 765; 174/260–266, 250
See application file for complete search history.

(56) References Cited

U.S. PATENT DOCUMENTS

| | | | | |
|---|---|---|---|---|
| 6,724,638 | B1 | 4/2004 | Inagaki et al. | 361/763 |
| 6,876,554 | B1 | 4/2005 | Inagaki et al. | 361/763 |
| 7,002,075 | B2 * | 2/2006 | Kambe et al. | 174/565 |
| 7,345,246 | B2 * | 3/2008 | Muramatsu et al. | 174/260 |
| 7,889,509 | B2 * | 2/2011 | Urashima et al. | 361/760 |
| 2004/0160751 | A1 * | 8/2004 | Inagaki et al. | 361/763 |
| 2005/0157478 | A1 | 7/2005 | Inagaki et al. | 361/763 |
| 2007/0258225 | A1 | 11/2007 | Inagaki et al. | 361/763 |

(Continued)

FOREIGN PATENT DOCUMENTS

| | | |
|---|---|---|
| CN | 1321411 A | 11/2001 |
| JP | 2006-351782 | 12/2006 |

OTHER PUBLICATIONS

Office Action (dated Aug. 4, 2010) issued in connection with corresponding Chinese Patent Application No. 20080088798.4, with English translation.

*Primary Examiner* — Hoa C Nguyen
(74) *Attorney, Agent, or Firm* — Kusner & Jaffe

(57) ABSTRACT

A method for manufacturing a wiring board with built-in component. The method provides a secure connection between a component and interlayer insulating layers so that the wiring board with built-in component has excellent reliability. The wiring board is manufactured through a core board preparation step, a component preparation step, an accommodation step and a height alignment step. In the core board preparation step, a core board having an accommodation hole therein is prepared. In the component preparation step, a ceramic capacitor having therein a plurality of protruding conductors which protrudes from a capacitor rear surface is prepared. In the accommodation step, the ceramic capacitor is accommodated in the accommodation hole with the core rear surface facing the same side as the capacitor rear surface. In the height alignment step, a surface of a top portion of the protruding conductor and a surface of a conductor layer formed on the core rear surface are aligned to the same height.

4 Claims, 10 Drawing Sheets

U.S. PATENT DOCUMENTS

| | | | |
|---|---|---|---|
| 2008/0055872 A1 | 3/2008 | Inagaki et al. | 361/760 |
| 2008/0142255 A1 | 6/2008 | Inagaki et al. | 174/260 |
| 2008/0144298 A1 | 6/2008 | Inagaki et al. | 361/763 |
| 2008/0158838 A1 | 7/2008 | Inagaki et al. | 361/761 |
| 2008/0158841 A1 | 7/2008 | Inagaki et al. | 361/782 |
| 2008/0169120 A1 | 7/2008 | Inagaki et al. | 174/255 |
| 2010/0014261 A1 | 1/2010 | Inagaki et al. | 361/763 |
| 2010/0118502 A1 | 5/2010 | Inagaki et al. | 361/766 |

* cited by examiner

WIRING BOARD WITH BUILT-IN COMPONENT AND METHOD FOR MANUFACTURING THE SAME

FIELD OF THE INVENTION

The present invention relates to a wiring board with built-in component in which a component, such as a capacitor, is accommodated therein, and to a method for manufacturing the same.

BACKGROUND OF THE INVENTION

With recent enhancements in the speed and performance of semiconductor integrated circuit devices (IC chips) used in microprocessors of computers and the like, the number of terminals tends to increase and the distance or pitch between terminals tends to decrease accordingly. In general, a plurality of terminals is densely arranged in an array on the bottom surface of an IC chip and the terminal group is connected to the terminal group of a motherboard in a flip chip manner. However, since the terminal group of the IC chip and the terminal group of the motherboard are substantially different to each other with respect to the pitch between the terminals, a method for manufacturing a package in which the IC chip is mounted on an IC chip mounting circuit board and the package is mounted on the motherboard is employed. In a wiring board constituting such a package, it is proposed to employ a built-in capacitor in order to reduce the switching noise of the IC chip or the like. As an example of such a wiring board, a wiring board in which a capacitor is accommodated in an accommodation hole of a core board made of polymer material, and a buildup layer is formed on top and rear surfaces of the core board is disclosed in Japanese Patent Application Laid-Open (kokai) No. 2006-351782 (see FIG. 1 etc.).

An example of the method for manufacturing the above-mentioned conventional wiring board will be described below. First, a core board 204 made of a polymer material is prepared. The core board 204 has an accommodation hole 203 opened at both core main surface 201 and a core rear surface 202 (refer to FIG. 23). Also, a capacitor 208 (refer to FIG. 23) having a plurality of surface electrodes 207 formed on a capacitor main surface 205 and a capacitor rear surface 206, respectively, is prepared. Next, a taping step for sticking an adhesive tape 209 on the core rear surface 202 is performed so as to seal an opening of the accommodation hole 203 at the core rear surface 202 side. Thereafter, an accommodation step for accommodating the capacitor 208 in the accommodation hole 203 is performed. As a result, the capacitor 208 is temporarily fixed in the accommodation hole 203 with the capacitor rear surface 206 being stuck on the adhesive face of the adhesive tape 209 (refer to FIG. 23).

Next, a resin insulating layer 210 made of a polymer material is formed on the core main surface 201 and the capacitor main surface 205 (refer to FIG. 24). Also, a part of the resin insulating layer 210 is used to fill a gap between an inner wall face of the accommodation hole 203 and a side face of the capacitor 208 to thereby fix the capacitor 208 (refer to FIG. 24). At this time, the adhesive tape 209 is peeled from the capacitor rear surface 206. Next, a resin insulating layer 211 made of a polymer material is formed on the core rear surface 202 and the capacitor rear surface 206 (refer to FIG. 25). Further, a laser boring step is performed to form a plurality of via holes, which penetrate the resin insulating layers 210, 211, in the predetermined positions to thereby expose the surface electrodes 207. After applying electroless copper plating to the resin insulating layers 210, 211 and to the inside of via holes, etching resist is formed thereon, and subsequently electrolytic copper plating is performed. Furthermore, etching resist is removed and soft etching is performed. As a result, a conductor layer 213 is pattern-formed on the resin insulating layers 210, 211, while a via conductor 212 is formed inside of each via hole (refer to FIG. 25).

Thereafter, a buildup layer is formed by alternately laminating a resin insulating layer and a conductor layer on the resin insulating layers 210, 211. As a result, a desired wiring board is produced.

PROBLEM(S) TO BE SOLVED BY THE INVENTION

A core board 204 and/or a capacitor 208 tend to have an uneven thickness due to a camber or the like which is produced at the time of manufacturing of the core board 204 and the capacitor 208. Further, since the capacitor 208 is generally formed to be thinner than the core board 204, a level difference is likely to occur between a core main surface 201 and a capacitor main surface 205. Therefore, when a resin insulating layer 210, 211 is formed on the core board 204 and the capacitor 208, a thickness variation of the resin insulating layer 210, 211 and a depth variation of the via holes formed in the resin insulating layer 210, 211 are likely to occur. Thus, when the above-mentioned laser boring step is performed to thereby form the via holes in a plurality of locations of the resin insulating layer 210, 211, it is difficult to adjust a laser output. That is, when the via hole is formed in a thin portion of resin insulating layer 210, 211, the laser containing high output penetrates the resin insulating layer 210, 211, and is irradiated to a surface electrode 207. This might result in the surface electrode 207 generating heat and being melted, depending on the conditions. On the other hand, when the via hole is formed in a thick portion of resin insulating layer 210, 211 (e.g., a portion of resin insulating layer 210 above the capacitor main surface 205), the laser penetrates the resin insulating layer 210, 211 and does not reach to the surface electrode 207. This might result in the surface electrode 207 being unsuccessfully exposed due to residual resin on the upper surface of the surface electrode 207. Further, when the via hole is formed in the thick portion of resin insulating layer 210, 211, the via hole is likely to be deep, and an aspect ratio (thickness/diameter of the via conductor 212) of the via conductor 212 formed in the via hole tends to be large whereby the via conductor 212 assumes an elongate shape. Thus, it is difficult to completely fill the via hole with the via conductor 212. Also, even if the via hole was completely filled with the via conductor 21, the productivity of the wiring board would deteriorate.

Even when the via conductor 212 is formed in the via hole, an end of the via conductor 212 cannot be successfully connected to the surface electrode 207 whereby the electrical connection therebetween is unlikely to be provided. In this case, a wiring board tends to have a defect, and reliability thereof is likely to deteriorate.

The present invention is accomplished in light of the above-mentioned problems, and an object of the present invention is to provide a method for manufacturing a wiring board with built-in component, the method materializes a secure connection between a component and interlayer insulating layers so that the wiring board with built-in component has excellent reliability. Further, another object of the present invention is to provide a suitable wiring board with built-in component produced by the above-mentioned manufacturing method.

SUMMARY OF THE INVENTION

In accordance with a first aspect for solving the above-mentioned problems, there is provided a method for manufacturing a wiring board with built-in component, comprising the steps of: a core board preparation step for preparing a core board which includes a core main surface, a core rear surface and an accommodation hole being open at least at the core rear surface; a component preparation step for preparing a component which is comprised of a component main body having a component main surface, a component rear surface and a component side face, and a plurality of protruding conductors formed on the component rear surface in a protruding manner; an accommodation step for accommodating the component in the accommodation hole with the core rear surface facing the same side as the component rear surface after the core board preparation step and the component preparation step; and a height alignment step for aligning a surface of a top portion of the plurality of protruding conductors and a surface of a conductor layer formed on the core rear surface in the same height after the accommodation step.

According to the method for manufacturing the wiring board with built-in component of the first aspect, since the surface of the top portion of the plurality of protruding conductors and the surface of the conductor layer formed on the core rear surface are aligned at the same height in the height alignment step, a rear surface side interlayer insulating layer can have a small thickness variation. Therefore, when a plurality of via holes used for forming via conductors which penetrates the rear surface side interlayer insulating layer is formed, the via conductor can be assuredly formed in each via hole because the via holes have a small variation in depth. As a result, since the electrical connection between the protruding conductors and the via conductors can be reliably provided, it is possible to prevent an occurrence of a defective product, thereby contributing to the wiring board with built-in component having excellent reliability.

Hereafter, the method for manufacturing the wiring board with built-in component according to the first aspect will be described.

In the core board preparation step, the core board constituting the above-mentioned wiring board with built-in component is produced by a conventionally known method in advance. The core board constituting the wiring board with built-in component assumes a plate-like shape having, for example, the core main surface, the core rear surface located on its opposite side and the accommodation hole for accommodating the component. The accommodation hole may be a non-through hole which is open at the core rear surface, or may be a through hole which is open at both the core main surface and the core rear surface.

The material used for forming the core board is not limited to a particular material. However, a preferred core board is made of a polymer material as a principal constituent. As specific examples of the polymer material used in forming the core board, it is possible to cite, for example, EP resin (epoxy resin), PI resin (polyimide resin), BT resin (bismaleimide triazine resin), PPE resin (polyphenylene ether resin) or the like. In addition, it is possible to use a composite material made of these resins and glass fibers (e.g., glass woven fabrics and nonwoven glass fabrics) or organic fibers, such as polyamide fibers.

In the component preparation step, the component constituting the above-mentioned wiring board with built-in component is produced by a conventionally known method in advance. The component is comprised of the component main body having the component main surface, the component rear surface and the component side face, and the plurality of protruding conductors formed on the component rear surface in a protruding manner. The shape of the component can be arbitrarily defined, however, a plate-like shape, for example, having a larger area than the component main surface is selected. The component preferably assumes a generally polygonal shape, viewed in plan, with a plurality of side faces. Examples of the polygonal shape in plan view include a generally rectangular shape, a generally triangular shape and a generally hexagonal shape, however, the component preferably assumes the generally rectangular shape in the plan view, which is an ordinary shape. In the following description, the "generally rectangular shape" does not mean a perfect rectangular shape in the plan view but a rectangle having a chamfered corner or a curved side face therein.

As a suitable component, it is possible to cite a capacitor, an integrated circuit element (IC chip), a MEMS (Micro Electro Mechanical Systems) element manufactured by a semiconductor manufacturing process or the like. The "integrated circuit element" means an element used mainly as a microprocessor for a computer or the like.

As a preferable example of the capacitor, it is possible to cite a chip capacitor, or a capacitor comprised of: a capacitor main body in which a plurality of inner electrode layers are laminated by sandwiching a dielectric layer therebetween; a plurality of capacitor via conductors connected to the plurality of inner electrode layers; a plurality of surface electrodes each connected to at least an end portion of the capacitor via conductors at the component rear surface; and a plurality of protruding conductors formed on the plurality of surface electrodes in a protruding manner. It is noted that the above-described capacitor is preferably a via array type capacitor having a plurality of capacitor via conductors which is disposed in the form of an array as a whole. With this structure, a reduction in inductance components of the capacitor is attainable and, hence, to achieve noise absorption and high-speed current supply for moderating a power fluctuation. Further, it becomes easy to attain a compact size of the entire capacitor, thereby achieving a reduction in size of the entire capacitor built-in wiring board. Furthermore, high electrostatic capacity is easily attainable despite the compact size, and a more stable power supply becomes possible.

Examples of the dielectric layer constituting a capacitor include a ceramic dielectric layer, a resin dielectric layer and a dielectric layer made of ceramic-resin compound materials or the like. Sintered bodies of high temperature sintered ceramics, such as alumina, aluminium nitride, boron nitride, silicon carbide and silicon nitride are suitably used as a ceramic dielectric layer. In addition, sintered bodies of low-temperature sintered ceramics, such as a glass ceramic in which an inorganic ceramic filler such as alumina is added to borosilicate glass or borosilicate lead glass, are suitably used. In this case, it is also preferred to use a sintered body of a dielectric ceramic, such as barium titanate, lead titanate and strontium titanate, depending on the application. In the case where the sintered body of the dielectric ceramic is used, a capacitor having a large electrostatic capacity becomes easily realizable. As a resin dielectric layer, an epoxy resin and a tetrafluoroethylene resin (PTFE) containing adhesives are used suitably. Further, in the case of a dielectric layer comprised of ceramic-resin compound material, barium titanate, lead titanate, strontium titanate and the like are suitably used as a ceramic material, and a thermosetting resin, such as epoxy resin, phenol resin, urethane resin, silicone resin, polyimide resin or unsaturated polyester; a thermoplastic resin, such as polycarbonate resin, acrylic resin, polyacetal resin or polypropylene resin; and a latex, such as nitrile-butadiene rubber, styrene-butadiene rubber or fluoride rubber, are suitably used as a resin material.

Although the forms of the inner electrode layer, the via conductor in the capacitor and the surface electrode are not particularly limited, a metallized conductor is preferable when the dielectric layer is, for example, a ceramic dielectric layer. The metallized conductor is formed in such a manner that a conductive paste containing metallic powder is applied by a conventionally known method, such as a metallize printing, and the thus-printed paste is thereafter fired. When forming the metallized conductor and the ceramic dielectric layer with a simultaneous firing method, the metallic powder in the metallized conductor is required to have a higher melting point than the firing temperature of the ceramic dielectric layer. For example, when the ceramic dielectric layer is comprised of a so-called high temperature sintered ceramic (e.g., alumina or the like), nickel (Ni), tungsten (W), molybdenum (Mo), manganese (Mn), or an alloy containing any one of these materials may be selected as metallic powder contained in the metallized conductor. When the ceramic dielectric layer comprised of a so-called low-temperature sintered ceramic (e.g., glass ceramic or the like), copper (Cu), silver (Ag) or the like, or an alloy containing one of these materials may be selected as metallic powder contained in the metallized conductor.

The plurality of protruding conductors constituting the component is formed on the component rear surface. The plurality of protruding conductors may be formed on the component main surface, in addition to the component rear surface. Further, the plurality of protruding conductors may be formed directly on the component rear surface, or may be formed on the plurality of surface electrodes which is disposed on the component rear surface. It is noted that the protruding conductors can be made of a metal material or the like having an electrical conductivity. Examples for the metal material for forming the protruding conductors, it is possible to cite copper, silver, iron, cobalt, nickel or the like.

When the plurality of protruding conductors is made, for example, of a metal material, it is preferably formed by a plating. In this way, the protruding conductor can be easily and cost-effectively formed. However, the plurality of protruding conductors may be formed by printing a metal paste, attaching a metal foil or etching a metal foil after attaching the larger sized metal foil than the protruding conductor. Exemplary method for forming the plurality of protruding conductors includes a simultaneous firing method or the like that the protruding conductors are simultaneously fired with other conductors constituting the dielectric layers and the component (i.e., the inner electrode layer, the capacitor via conductor and the surface electrode). Further, another exemplary method may be a post-firing method that the protruding conductors is fired after firing the dielectric layers and the conductors constituting the component. When the protruding conductors are formed by the simultaneous firing method, the manpower required for producing the component can be reduced, thereby contributing to an easy and cost-effective manufacturing of the component.

When the plurality of protruding conductors is formed on the plurality of surface electrodes in a protruding manner, the plurality of protruding conductors preferably has a thickness greater than that of the plurality of surface electrodes. More specifically, the plurality of protruding conductors preferably has a thickness of 100 micrometers or more to 300 micrometers or less before the height alignment step, more preferably 180 micrometer or more to 200 micrometers or less. When the plurality of protruding conductors has a thickness of less than 100 micrometers, each protruding conductor is unlikely to protrude from the core rear surface at the time of accommodating the component in the accommodation hole. Further, it becomes difficult to conduct the height alignment step that removes the top portion of the protruding conductor so as to align with the surface of the conductor layer. On the other hand, when the plurality of protruding conductors has a thickness of larger than 300 micrometers, it takes a long time to remove (e.g., grind or the like) the top portion of the protruding conductor, thereby deteriorating the productivity of the component.

Further, when the plurality of protruding conductors is formed, in a protruding manner, on the plurality of surface electrodes provided on the component rear surface, a diameter of the plurality of protruding conductors is preferably equal to that of the plurality of surface electrodes. In this way, since a cross-section area of the protruding conductor is larger compared to the case where the diameter of protruding conductor is smaller than that of surface electrode, resistance of the protruding conductor can be reduced, as well as the conductivity of the protruding conductor is improved. Further, since the diameter of protruding conductor is equal to that of the surface electrode, a gap between the protruding conductors is reliably formed when the protruding conductors are each formed, in a protruding manner, on the surface electrodes disposed with a gap therebetween. As a result, a short circuit failure due to a mutual contact between the protruding conductors can be prevented.

A resin cover layer forming step is preferably included in the component preparation step. The resin cover layer forming step is for forming a resin cover layer which at least covers the component rear surface among the component main surface, the component rear surface and the component side face. In this case, in the height alignment step, the surface of the top portion and the resin cover layer covering the component rear surface are preferably simultaneously ground. In this way, by conducting the resin cover layer forming step, at least a part of the resin cover layer covering the component rear surface is disposed between the plurality of protruding conductors. Thus, since the plurality of protruding conductors is fixed by the part of the resin cover layer covering the component rear surface, each protruding conductor can be prevented from being damaged even when a large force is exerted on each protruding conductor in the height alignment step. In the height alignment step, the top portion and the resin cover layer are simultaneously ground. As a result, the height alignment step is simplified, thereby contributing to an easy and cost-effective manufacturing of the wiring board with built-in component.

In consideration of insulation, heat resistance, moisture resistance of the interlayer insulating layer, preferred polymer materials for forming the resin cover layer are cited from, for example, a thermosetting resin, such as epoxy resin, phenol resin, urethane resin, silicone resin, polyimide resin; and a thermoplastic resin, such as polycarbonate resin, acrylic resin, polyacetal resin or polypropylene resin. Further, a material or the like in which glass fillers are added to these resins may be employed.

A thickness of the resin cover layer covering the component rear surface is preferably greater than that of the plurality of protruding conductors. That is, the surface of the top portion of the protruding conductors may be covered with the resin cover layer or may be exposed from an outer side face of the resin cover layer. When the resin cover layer covering the component rear surface is thinner than the plurality of protruding conductors, the top portion of each protruding conductor projects from the surface of resin cover layer and is likely to be damaged in the case where a large force is exerted on each protruding conductor in the height alignment step. When the resin cover layer covering the component rear surface is thicker than the plurality of protruding conductors, it takes time to remove (grinding or the like) the resin cover layer, thereby causing deterioration in productivity of the component.

The resin cover layer may only cover the component rear surface, or may cover at least either the component main surface or the component side face in addition to the component rear surface. When the resin cover layer covers the component side face, a gap between the accommodation hole and the component becomes small. As a result, the component is prevented from being damaged even when a large force is exerted on the component in the height alignment step.

In the subsequent accommodation step, the component is accommodated in the accommodation hole with the core rear surface facing the same side as the component rear surface face. The component may be completely accommodated in the accommodation hole, or may be accommodated in the accommodation hole in a state where a part of the component projects from the opening of the accommodation hole. Further, when the accommodation hole is a through hole being open at both the core main surface and the core rear surface, the accommodation step may be conducted in such a manner that opening of the accommodation hole at the core main surface side is sealed by an adhesive tape having an adhesive face, and then the adhesive tape may be removed after the height alignment step.

After the accommodation step and prior to the height alignment step, a resin layer forming step for forming a resin layer on the core rear surface and the component rear surface and filling a gap between an inner wall face of the accommodation hole and the component side face with a part of the resin layer is conducted. Thereafter, a fixation step for fixing the component by hardening the resin layer is conducted. In the height alignment step, the resin layer and the surface of the top portion are preferably simultaneously ground. In this way, since the component can be fixed by the resin layer prior to the height alignment step, the component can be prevented from being damaged even when a large force is exerted on the component in the height alignment step. Furthermore, the above-mentioned gap can be filled with the resin layer to a bottom of the accommodation hole, thereby preventing an occurrence of a void or the like. Therefore, the wiring board with built-in component having an excellent reliability can be produced. Moreover, the height alignment step is conducted by simultaneously grinding the surface of the top portion and the resin layer. As a result, the height alignment step is simplified, thereby contributing to an easy and cost-effective manufacturing of the wiring board with built-in component.

In consideration of insulation, heat resistance, moisture resistance of the resin layer, preferred polymer materials for forming the resin cover layer are cited from, for example, a thermosetting resin, such as epoxy resin, phenol resin, urethane resin, silicone resin, polyimide resin; and a thermoplastic resin, such as polycarbonate resin, acrylic resin, polyacetal resin or polypropylene resin. Further, an example of the polymer materials may include a material or the like in which glass fillers are added to the above-mentioned thermosetting resin or the thermoplastic resin.

As examples of the method for forming the resin layer, it is possible to cite: a method in which a resin material is applied (or sprayed) to the core rear surface and the component rear surface; a method in which a resin sheet is stuck on the core rear surface and the component rear surface; and a method in which a mask having opening portions that corresponds to the positions for forming a resin layer is disposed on the core rear surface and the component rear surface, and, thereafter, a resin material is printed thereon through the mask.

When the component side face is covered with the resin cover layer, the surface of the resin cover layer covering the component side face is preferably disposed in parallel with the component side face. When the resin cover layer is not disposed in parallel with the component side face, it is inclined with respect to the inner wall face of the accommodation hole. As a result, it is unlikely that a part of the resin layer is successfully filled in the gap between the surface of resin cover layer covering the component side face and the inner wall face of the accommodation hole with.

In the fixation step, the gap is filled with the part of the resin layer, and the resin layer is hardened to thereby fix the component. When the resin layer is a thermosetting resin, it is possible to employ a process that an unhardened resin layer is heated so as to be hardened. Also, when the resin layer is a thermoplastic resin, it is possible to employ a process that a resin layer heated in the resin layer forming step is cooled down so as to be hardened.

In the subsequent height alignment step, the surface of top portion of the plurality of protruding conductors and the surface of conductor layers formed on the core rear surface are aligned in the same height. Thereafter, the main surface side laminated wiring portion is formed on the core main surface, and the rear surface side laminated wiring portion is formed on the core rear surface to thereby complete the wiring board with built-in component.

As examples of the method for aligning the surface of top portion and the surface of conductor layer to the same height in the height alignment step, it is possible to cite a method lowering the plurality of protruding conductors so as to align the surface of top portion and the surface of the conductor layer to the same height, a method making the conductor layer thin so as to align the surface of top portion and the surface of the conductor layer to the same height, a method making the plurality of protruding conductors high so as to align the surface of top portion and the surface of the conductor layer to the same height, and a method making the conductor layer thick so as to align the surface of top portion and the surface of the conductor layer to the same height. In the above-mentioned methods, the preferable method is that the plurality of protruding conductors is lowered so as to align the surface of top portion and the surface of the conductor layer to the same height. When the method making the surface of conductor layer thin is adopted, it is unlikely to align the surface of top portion and the surface of the conductor layer to the same height because the conductor layer is originally very thin and difficult to make it thin. Further, when either the method making the plurality of protruding conductors high or the method making the conductor layer thick is adopted, an additional process for printing a conductive paste to the surface of top portion of the protruding conductor and the surface of conductor layer is required. As a result, manufacturing of the wiring board with built-in component is likely to be complicated and costly. When the method lowering the plurality of protruding conductor low is adopted so as to align the surface of top portion and the surface of conductor layer to the same height, the component is formed thinner than the core board, and the plurality of protruding conductors is preferably formed to have a thickness to such an extent that they protrude from the core rear surface when the component is accommodated in the accommodation hole. In this way, a process for lowering each protruding conductor (e.g., grinding or the like) can be securely conducted.

As the method for aligning the surface of the top portion with the surface of conductor layer by lowering the plurality of protruding conductors or thinning the conductor layer, it is possible to cite a method mechanically removing at least either the surface of top portion or the surface of the conductor layer, or a method chemically removing at least either the surface of top portion or the surface of the conductor layer. However, in the height alignment step, at least either the top portion or the conductor layer is preferably mechanically removed. In this way, the height alignment step can be easily and cost-effectively conducted compared to the case where at least either the top portion or the conductor layer is chemically removed.

As a method for mechanically removing at least either the top portion or the conductor layer, it is possible to cite a method that at least either a part of top portion or a part of conductor layer is cut or a method that at least either the surface of top portion or the surface of conductor layer is ground. The method that at least either the surface of top portion or the surface of conductor layer is ground may adopt a grinding process using a belt sander device furnished with sandpaper or a buffering process conducted in such a manner that a disc-like nonwoven fabric or the like containing an abrading agent on outer circumference face thereof is rotated and pressed against the surface of top portion or the surface of conductor layer. An arithmetic average coarseness of the grinding surface of the sandpaper and a grain diameter of the abrading agent are preferably equal to an arithmetic average coarseness of the surface of top portion or the surface of conductor layer after grinding.

On the other hand, as the method at least either the top portion or the conductor layer is chemically removed, it is possible to cite a method for removing at least either a part of the top portion or a part of the conductor layer with an etching solution.

In the height alignment step, the surface of the top portion is preferably ground in a state where a hardened resin material is disposed between the plurality of protruding conductors. In this way, since the plurality of protruding conductors is fixed by the hardened resin material, the protruding conductors can be prevented from being damaged even when a large force is exerted on each protruding conductor in the height alignment step. Examples of resin material include a resin cover layer covering the component rear surface, the above-mentioned resin layer or the like.

After the height alignment step, a rear surface side interlayer insulating layer forming step in which a rear surface side interlayer insulating layer is formed on the core rear surface and the component rear surface; a via hole forming step in which a via hole penetrating the rear surface side interlayer insulating layer is formed by a laser boring process so as to expose the surface of the top portion; and a via conductor forming step in which a via conductor is formed inside the via hole, are conducted. In this way, since the rear surface side interlayer insulating layer is formed on the core rear surface and the component rear surface those of which are flattened in the height alignment step, a variation in thickness of the rear surface side interlayer insulating layer can be reduced. Therefore, when a plurality of via holes is formed in the via hole forming step, the via conductor can be assuredly formed in each via hole in the via conductor forming step because there is only a small variation in depth of the via hole. As a result, the electrical connection between the protruding conductor and the via conductor can be reliably provided, thereby preventing an occurrence of a defective product and contributing to the wiring board with built-in component having an excellent reliability.

The resin cover layer and the resin layer may be made of the same material as the rear surface side interlayer insulating layer which is formed in the rear surface side interlayer insulating layer forming step, or may be made of a different material from that of the rear surface side interlayer insulating layer. However, they are preferably made of the same material as the rear surface side interlayer insulating layer. In this way, any additional material is not necessarily prepared apart from the material of the rear surface side interlayer insulating layer when forming the resin cover layer and the resin layer. Therefore, the number of materials required for manufacturing the wiring board with built-in component decreases, and a cost-effective wiring board with built-in component can be produced.

"The same material as the rear surface side interlayer insulating layer" means a same polymer material as that of the rear surface side interlayer insulating layer and having the same thermal expansion coefficient as that of the rear surface side interlayer insulating layer. Therefore, since a difference in a thermal expansion coefficient between the resin cover layer, the resin layer and the rear surface side interlayer insulating layer is unlikely to cause, it is possible to prevent a delamination between these layers. Thus, reliability of the wiring board with built-in component is further improved.

In this specification, a "thermal expansion coefficient" means a thermal expansion coefficient in a perpendicular direction (XY direction) to a thickness direction (Z direction), and a value is measured by a TMA (thermal mechanical analyzer) at a temperature range from 0° C. to 100° C. The "TMA" means a thermal mechanical analyzer specified in, for example, JPCA-BU01.

In accordance with a second aspect for solving the above-mentioned problems, there is provided a wiring hoard with built-in component, comprising: a core board including a core main surface, a core rear surface and an accommodation hole being open at least at the core rear surface, wherein a core main surface side conductor layer is formed on the core main surface, and a core rear surface side conductor layer is formed on the core rear surface; a component comprised of: a component main body having a component main surface, a component rear surface and a component side face; and a plurality of protruding conductors formed on the component rear surface in a protruding manner, wherein the component is accommodated in the accommodation hole with the core rear surface facing the same side as the component rear surface; a main surface side laminated wiring portion having a laminated structure in which a main surface side interlayer insulating layer and a main surface side conductor layer are laminated on the core main surface, and providing an integrated circuit element mounting region for mounting an integrated circuit element on a surface thereof; and a rear surface side laminated wiring portion having a laminated structure in which a rear surface side interlayer insulating layer and a rear surface side conductor layer are laminated on the core rear surface, and providing a connection terminal portion, which is connectable to a motherboard, on a surface thereof, wherein a surface of the core rear surface side conductor layer and a surface of a top portion of the plurality of protruding conductors are aligned in the same plane, wherein an arithmetic average coarseness of the surface of the core rear surface side conductor layer and the surface of the top portion is rougher than an arithmetic average coarseness of a surface of the core main surface side conductor layer, and wherein the core rear surface side conductor layer is thinner than the core main surface side conductor layer.

Thus, according to the second aspect, since the surface of the core rear surface side conductor layer and the surface of the top portion of plurality of protruding conductors are located in the same plane, the rear surface side interlayer insulating layer formed on the core rear surface can have a reduced variation in thickness. Therefore, when the plurality of via conductors is formed on the rear surface side interlayer insulating layer, a variation in depth of the via hole where the via conductors are formed is reduced whereby the via conductor can be reliably formed. As a result, the electrical connection between the protruding conductors and the via conductors can be securely provided, thereby preventing an occurrence of a defective product and contributing to the wiring board with built-in component having excellent reliability.

The rear surface side interlayer insulating layer located nearest to the core rear surface preferably has a thickness variation of 5 micrometers or less, more preferably 2 micrometers or less. In the above-mentioned case, the via conductors are preferably formed in the rear surface side interlayer insulating layer located nearest to the core rear surface. When the rear surface side interlayer insulating layer located nearest to the core rear surface has the thickness variation of larger than 5 micrometers and the plurality of via holes is formed therein, a variation in depth of the via hole cannot be reduced. Therefore, the via conductor cannot be reliably formed in the via hole and the electrical connection between the protruding conductor and the via conductor cannot be reliably provided. As a result, reliability of the wiring board with built-in component deteriorates.

In consideration of insulation, heat resistance, moisture resistance of the main surface side interlayer insulating layer which constitutes the main surface side laminated wiring portion and the rear surface side interlayer insulating layer which constitutes the rear surface side laminated wiring portion, preferred polymer materials for forming the main surface side interlayer insulating layer and the rear surface side interlayer insulating layer are cited from, for example, a thermosetting resin, such as epoxy resin, phenol resin, urethane resin, silicone resin, polyimide resin; and a thermoplastic resin, such as polycarbonate resin, acrylic resin, polyacetal resin or polypropylene resin. In addition, a composite material of these resin and glass fibers (glass woven fabric or non-woven glass fabric) or organic fibers, such as polyamide fibers, or alternatively, a resin-resin composite material formed in such a manner that thermosetting resin, such as epoxy resin, is impregnated with three dimensional mesh-like fluorocarbon resin base material, such as continuous porosity PTFE may be employed.

An "Arithmetic average coarseness" described in this specification is an arithmetic average coarseness Ra defined by JIS B0601. It is noted that a measuring method for the arithmetic average coarseness Ra shall be pursuant to JIS B0651.

DESCRIPTION OF REFERENCE NUMERALS

Figure 1:
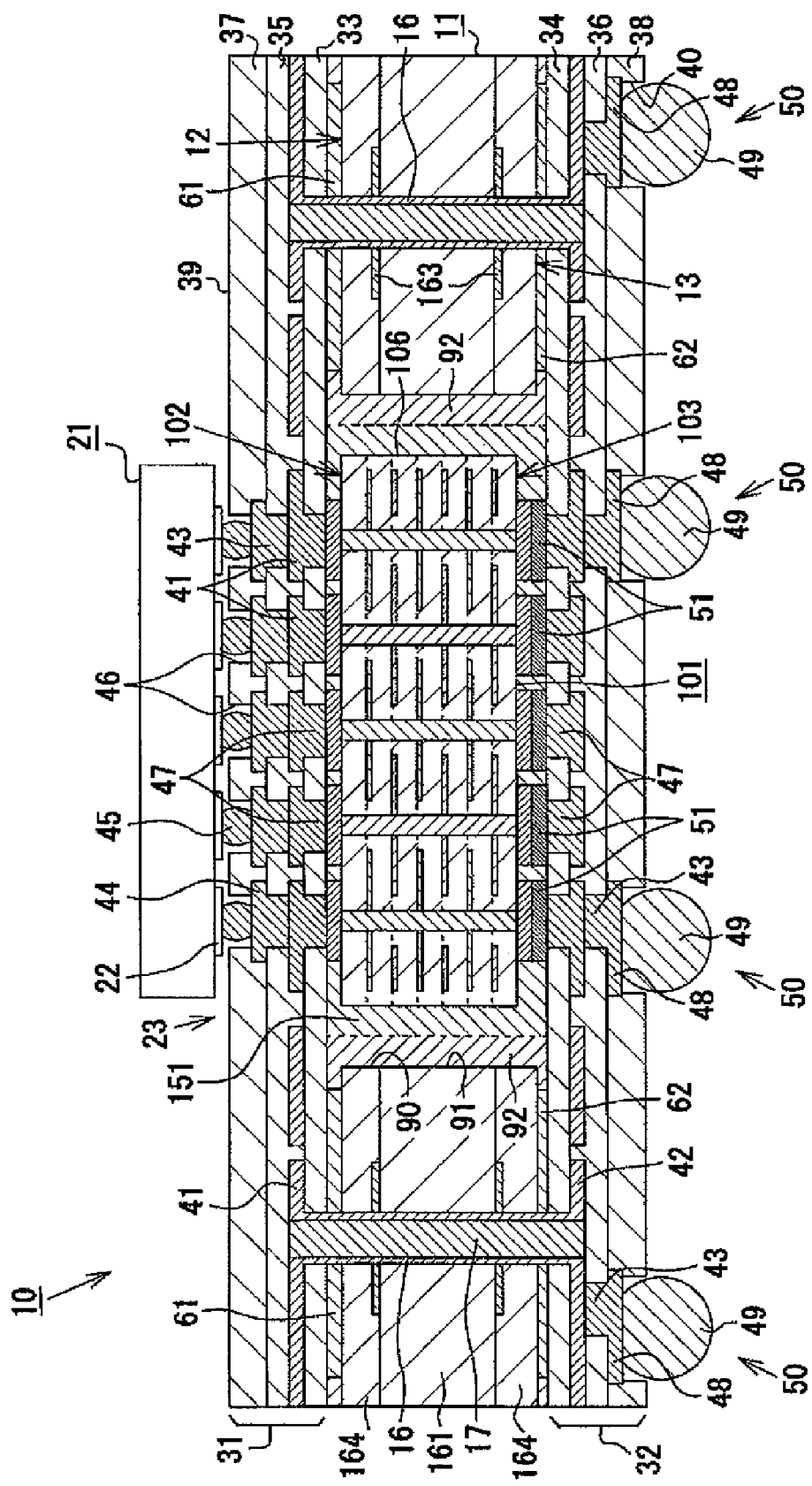
FIG. 1 is a schematic sectional view showing a wiring board according to an embodiment of the present invention.

10: wiring board with built-in component (wiring board)
11: core board
12: core main surface
13: core rear surface
21: IC chip serving as an integrated circuit element
23: IC chip mounting region serving as an integrated circuit element mounting region
31: main surface side buildup layer serving as a main surface side laminated wiring portion
32: rear surface side buildup layer serving as a rear surface side laminated wiring portion
33, 35: main surface side resin insulating layer serving as a main surface side interlayer insulating layer
34, 36: rear surface side resin insulating layer serving as a rear surface side interlayer insulating layer
39: surface of the main surface side laminated wiring portion
41: main surface side conductor layer
42: rear surface side conductor layer
47: via conductor
50: connection terminal portion
51: protruding conductor
52: top portion
61: core main surface side conductor layer
62: core rear surface side conductor layer serving as a conductor layer formed on a core rear surface 90: accommodation hole
91: inner wall face
92: resin layer
101: ceramic capacitor serving as a component
102: capacitor main surface serving as a component main surface
103: capacitor rear surface serving as a component rear surface
104: ceramic sintered body serving as a component main body
106: capacitor side face serving as a component side face
121: rear surface side power supplying electrode serving as a surface electrode
122: rear surface side grounding electrode serving as a surface electrode
151: resin cover layer serving as a resin material
182: via hole

DETAILED DESCRIPTION OF THE INVENTION

A wiring board with built-in component according to an embodiment of the present invention will be described in detail with reference to the drawings.

Referring to FIG. 1, there is shown a wiring board with built-in component 10 (hereinafter referred to as a "wiring board"). According to the illustrated embodiment, wiring board 10 is a wiring board for mounting an IC chip. The wiring board 10 is comprised of a rectangular plate-like core board 11, a main surface side buildup layer 31 (main surface side laminated wiring portion) formed on a core main surface 12 of the core board 11 (upper surface in FIG. 1) and a rear surface side buildup layer 32 (rear surface side laminated wiring portion) formed on a rear surface 13 of the core board 11 (lower surface in FIG. 1).

The main surface side buildup layer 31 formed on the core main surface 12 of the core board 11 has a structure in which two main surface side resin insulating layers 33 and 35 made of thermosetting resin (epoxy resin) and a main surface side conductor 41 made of copper are alternately laminated. Terminal pads 44 are formed in plural locations on the surface of the second main surface side resin insulating layer 35 in the form of an array. Further, the surface of the main surface side resin insulating layer 35 is entirely covered with a solder resist 37. Opening portions 46 to which the terminal pads 44 are exposed are formed on predetermined locations of the solder resist 37. A plurality of solder bumps 45 are disposed on the surfaces of the terminal pads 44, respectively. Each solder bump 45 is electrically connected to a surface connection terminal 22 of a rectangular plate-like IC chip 21 (integrated circuit element). In addition, a region comprised of each terminal pad 44 and each solder bump 45 serves as an IC-chip mounting region 23 (integrated circuit element mounting region) for mounting the IC chip 21. The IC-chip mounting region 23 is formed on a surface 39 of the main surface side buildup layer 31. Via conductors 43 are formed in plural locations in the second main surface side resin insulating layer 35. A portion serving as a lower end of each via conductor 43 is connected to a main surface side conductor layer 41 formed on the surface of main surface side resin insulating layer 33. Further, a portion serving as an upper end of each via conductor 43 is connected to the main surface side conductor layer 41 or the terminal pad 44 formed on the surface of main surface side resin insulating layer 35. The via conductors 43 provides an electrical connection between the main surface side conductor layer 41 and the terminal pads 44.

As shown in FIG. 1, the rear surface side buildup layer 32 formed on the core rear surface 13 of the core board 11 is substantially identical to that of the main surface side buildup layer 31. That is, the rear surface side buildup layer 32 has a structure in which two rear surface side resin insulating layers 34 and 36 made of thermosetting resin (epoxy resin) and a rear surface side conductor layer 42 are alternately laminated. Via conductors 47 are formed in plural locations in the first rear surface side resin insulating layer 34. A portion serving as a lower end of each via conductor 47 is connected to the rear surface side conductor layer 42 formed on the surface of rear surface side resin insulating layer 34. Further, via conductors 43 are formed in plural locations in the second rear surface side resin insulating layer 36. BGA pads 48 electrically connected to the rear surface side conductors 42 through the via conductors 43 are formed in an array-shape on the lower surface of the rear surface side resin insulating layer 36. Furthermore, the lower surface of the rear surface side resin insulating layer 36 is almost entirely covered with a solder resist 38. Opening portions 40 to which the BGA pads 48 are exposed are formed in the predetermined locations of the solder resist 38. A plurality of solder bumps 49 providing an electrical connection to a motherboard (not illustrated) is disposed on the surfaces of the BGA pads 48. That is, the BGA pads 48 and the solder bumps 49 constitute connection terminal portions 50 formed on the surface of the rear surface side buildup layer 32. The wiring board 10 as shown in FIG. 1 is mounted on a motherboard (not illustrated) through each solder bump 49.

As shown in FIG. 1, the core board 11 according to the illustrated embodiment assumes a generally rectangular plate-like shape as viewed in plan. Exemplary dimensions are 25.0 mm long×25.0 mm wide×1.0 mm thick. The core board 11 is comprised of a substrate 161 made of glass epoxy, a sub-substrate 164 made of epoxy resin to which inorganic fillers, such as silica filler, are added and formed on an upper surface and a lower surface of the substrate 161 and a conductor layer 163 made of copper and formed on the upper surface and the lower surface of the substrate 161. Further, the core board 11 includes a plurality of through hole conductors 16 which penetrates the core main surface 12, the core rear surface 13 and the conductor layer 163. The through hole conductors 16 provide an electrical connection between the core main surface 12 and the core rear surface 13 of the core board 11, as well as providing an electrical connection to the conductor layer 163. It is noted that the inside of the through hole conductor 16 is filled with a plugging body 17, such as an epoxy resin. An upper end of the through hole conductor 16 is electrically connected to a part of the main surface side conductor layer 41 formed on the surface of the main surface side resin insulating layer 33. A lower end of the through hole conductor 16 is electrically connected to a part of the rear surface side conductor layer 42 formed on the lower surface of the rear surface side resin insulating layer 34.

As shown in FIG. 1, a core main surface side conductor layer 61 made of copper is pattern-formed on the core main surface 12 of the core board 11 and provides an electrical connection to the through hole conductor 16. Similarly, a core rear surface side conductor layer 62 (conductor layer) is pattern-formed on the core rear surface 13 of the core board 11 and provides an electrical connection to the through hole conductor 16. The core rear surface side conductor layer 62 is thinner than the core main surface side conductor layer 61 (75 micrometers in thickness) and is set to be 65 micrometers in this embodiment. Further, an arithmetic average coarseness Ra of the surface of core rear surface side conductor layer 62 and a surface of a top portion 52 (described below) is coarser than an arithmetic average coarseness Ra (0.5 micrometer in this embodiment) of the surface of the core main surface side conductor layer 61, and, more particularly, it is set to be 0.8 micrometer.

As shown in FIG. 1, the core board 11 has a rectangular-shaped accommodation hole 90, as seen from the plane view, which opens at both center portions of the core main surface 12 and the core rear surface 13. That is, the accommodation hole 90 is a through-hole. A ceramic capacitor 101 (component) is embedded in the accommodation hole 90 with the capacitor rear surface 103 facing the same side as the core rear surface 13 of the core board 11. The ceramic capacitor 101 in this embodiment assumes a rectangular plate-like shape. Exemplary dimensions are 10.0 mm long×10.0 mm wide×0.8 mm thick. The ceramic capacitor 101 is formed to be thinner than the core board 11. In the core board 11, the ceramic capacitor 101 is disposed in a region immediately below the IC-chip mounting area 23. The dimensions of the IC-chip mounting region 23 (an area of the region where the surface connection terminals 22 of the IC-chip are formed on) are made smaller than those of a capacitor main surface 102 of the ceramic capacitor 101. Thus, the IC-chip mounting region 23, as viewed in the thicknesswise direction of the ceramic capacitor 101, is disposed within the capacitor surface 102 of the ceramic capacitor 101.

As shown in FIGS. 1 to 4, the ceramic capacitor 101 according to this embodiment is a so-called "via array type capacitor". A ceramic sintered body 104 (component main body) comprising the ceramic capacitor 101 assumes a plate-like shape and has the capacitor main surface 102 (upper surface in FIG. 1) serving as a component main surface, a capacitor rear surface 103 (lower surface in FIG. 1) serving as a component rear surface and four capacitor side faces 106 (right and left faces in FIG. 1) serving as a component side face.

Figure 2:
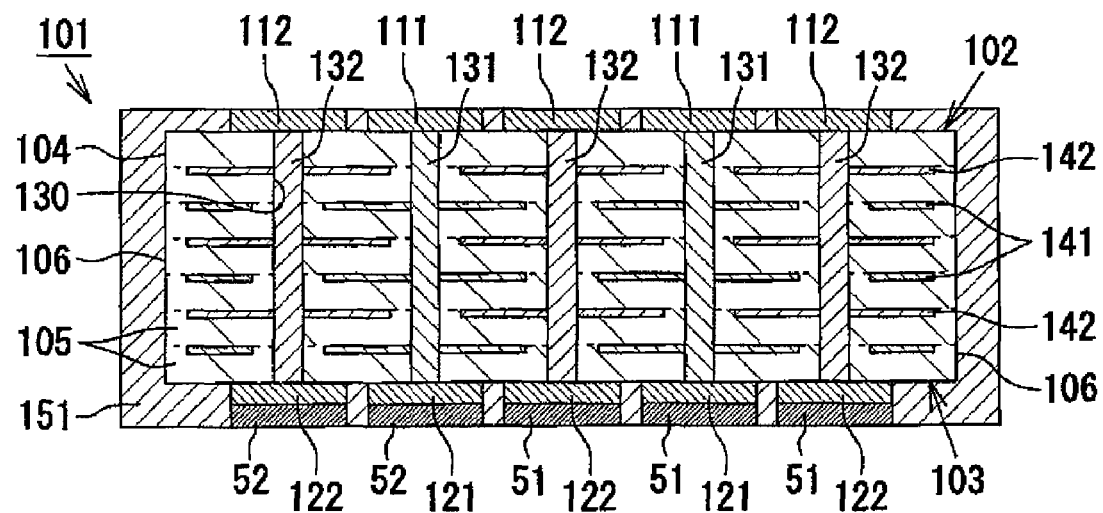
FIG. 2 is a schematic sectional view showing a ceramic capacitor.
Figure 3:
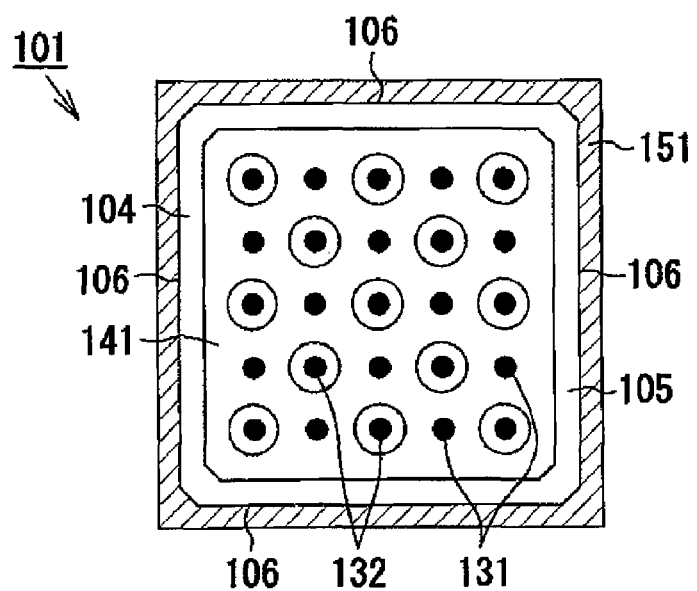
FIG. 3 is an explanatory view for explaining a connection in an inner layer of the ceramic capacitor.
Figure 4:
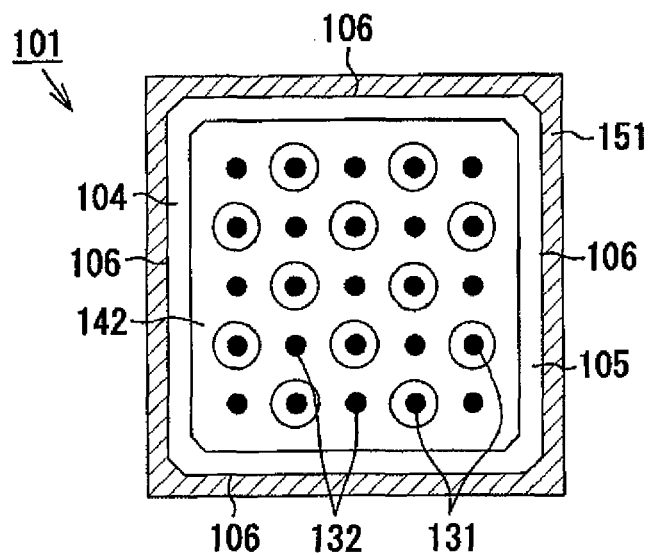
FIG. 4 is an explanatory view for explaining a connection in an inner layer of the ceramic capacitor.

As shown in FIG. 2, the ceramic sintered body 104 has a structure in which a power supplying inner electrode 141 and a grounding inner electrode 142 which are alternately laminated by sandwiching a ceramic dielectric layer 105. The ceramic dielectric layer 105 is comprised of a sintered body of barium titanate, i.e., a kind of high-dielectric-constant ceramic, and functions as a dielectric (insulator) between the power supplying inner electrode layer 141 and the grounding inner electrode layer 142. The power supplying inner electrode layer 141 and the grounding inner electrode layer 142 are comprised of nickel as a main constituent.

As shown in FIGS. 1 to 4, a plurality of via holes 130 is formed in the ceramic sintered body 104. These via holes 130 penetrate the ceramic sintered body 104 in its thickness direction, and are disposed on the entire surface of the ceramic sintered body 104 in a lattice pattern (the form of an array). In each via hole 130, a plurality of capacitor via conductors 131, 132 comprised mainly of nickel is formed so as to communicate between the capacitor main surface 102 and the capacitor rear surface 103 of the ceramic sintered body 104. In this embodiment, since the diameter of via holes 130 is set to be about 100 micrometers, the diameter of capacitor via conductors 131, 132 is also set to be about 100 micrometers. Each power supplying capacitor via conductor 131 penetrates each power supplying inner electrode 141 so as to provide an electrical connection therebetween. Each grounding capacitor via conductor 132 penetrates each grounding inner electrode 142 so as to provide an electrical connection therebetween. Each power supplying capacitor via conductor 131 and each grounding capacitor via conductor 132 are disposed in the form of an array as a whole. In this embodiment, for explanatory purposes, the capacitor via conductors 131, 132 are illustrated by 5×5 rows forming an array. However, the actual array has more rows.

As shown in FIG. 2 or the like, a plurality of main surface side power supplying electrodes 111 and a plurality of main surface side grounding electrodes 112 are formed on the capacitor main surface 102 of the ceramic sintered body 104 so as to project from the capacitor main surface 102. Although each main surface side grounding electrode 112 is individually formed on the capacitor main surface 102, it may be integrally formed. The main surface side power supplying electrode 111 is directly connected to an end face of the plural power supplying capacitor via conductors 131 at the capacitor main surface 102. The main surface side grounding electrode 112 is directly connected to an end face of the plural grounding capacitor via conductors 132 at the capacitor main surface 102.

Also, a plurality of rear surface side power supplying electrode terminals 121 (terminal electrodes) and a plurality of rear surface side grounding electrodes 122 (terminal electrodes) are formed on the capacitor rear surface 103 of the ceramic sintered body 104 so as to project from the capacitor rear surface 103. Although each rear surface side grounding electrode 122 is individually formed on the capacitor rear surface 103, it may be integrally formed. The rear surface side power supplying electrode 121 is directly connected to an end face of the plural power supplying via conductors 131 at the capacitor rear surface 103. The rear surface side grounding electrode 122 is directly connected to an end face of the plural grounding via conductors 132 at the capacitor rear surface 103. Thus, the power supplying electrodes 111, 121 are electrically connected to the power supplying via conductor 131 and the power supplying inner electrode layer 141. Likewise, the grounding electrodes 112, 122 are electrically connected to the grounding via conductor 132 and the grounding inner electrode layer 142.

As shown in FIG. 2 or the like, the electrodes 111, 112, 121, 122, which are comprised mainly of nickel, have the surfaces thereof entirely covered with a copper plating layer (not illustrated). In this embodiment, the electrodes 111, 112, 121, 122 assume a generally rectangular shape in the plan view and have the diameter of about 500 micrometers, the thickness of about 50 micrometers, and the minimum pitch therebetween of about 580 micrometers.

As shown in FIGS. 1 and 2, a protruding conductor 51 is formed on each rear surface side power supplying electrode 121 and each rear surface side grounding electrode 122. The protruding conductor 51 according to this embodiment is a conductor (copper post) made by copper plating. Each protruding conductor 51 assumes a columnar shape with a uniform circular cross-section area. The center axis of each protruding conductor 51 aligns with the center of the electrode 121, 122. The surface of the top portion 52 of each protruding conductor 51 assumes a circular shape and is parallel to the capacitor main surface 102. Further, the diameter of each protruding conductor 51 is equal to that of the electrode 121, 122 and is larger than that of the capacitor via conductor 131, 132 (about 100 micrometers). The diameter of each protruding conductor 51 is set to be about 500 micrometers in this embodiment. The thickness of each protruding conductor 51 in the completed wiring board 10 is set to be 100 micrometers in this embodiment. That is, each protruding conductor 51 is thicker than the electrode 121, 122. The surface of the top portion 52 of each protruding conductor 51 is located in the same plane as the surface of the core rear surface side conductor layer 62. Each protruding conductor 51 is connected to the via conductor 47 formed in the plural locations of the rear surface side resin insulating layer 34 that is disposed on the nearest to the core rear surface 13. According to this embodiment, the rear surface side resin insulating layer 34 has a thickness of about 50 micrometers and variation in the thickness is 5 micrometers.

As shown in FIGS. 1 to 4, the ceramic sintered body 104 is covered with a resin cover layer 151. The resin cover layer 151 covers one capacitor main surface 102, one capacitor rear surface 103 and whole four capacitor side faces 106. When the ceramic capacitor 101 is built in the wiring board 10, the resin cover layer 151 covering the capacitor main surface 102 exposes the electrodes 111, 112 and, thus, it does not completely cover the capacitor main surface 102. Similarly, the resin cover layer 151 covering the capacitor rear surface 103 exposes the surface of the top portion 52 of the protruding conductor 51 formed on the electrode 121, 122, and, thus, the resin cover layer 151 does not completely cover the capacitor rear surface 103. The resin cover layer 151 covering the capacitor main surface 102 has a thickness of 50 micrometers. The resin cover layer 151 covering the capacitor rear surface 103 has a thickness of 150 micrometers. The resin cover layer 151 covering the capacitor side face 106 has a thickness of 1000 micrometers. That is, the resin cover layer 151 covering the capacitor rear surface 103 is thicker than the protruding conductor 51, and the surface of the top portion 52 of each protruding conductor 51 is covered by the resin cover layer 151. The resin cover layer 151 is made of the same material (i.e., epoxy resin which is a thermosetting resin) as the resin insulating layers 33-36. The thermal expansion coefficient of the resin cover layer 151 is also the same as that of the resin insulating layers 33-36, more particularly, it is set to be about 10-60 ppm/° C. (more specifically, 20 ppm/° C. or thereabout). The resin cover layer 151 has a larger thermal expansion coefficient than that of the ceramic sintered body 104.

As shown in FIG. 1 or the like, a gap between an inner wall face 91 of the accommodation hole 90 and the surface of the resin cover layer 151 covering the capacitor side face 106 of the ceramic capacitor 101 is filled with a part of resin layer 92 formed on the core rear surface 13 and the capacitor rear surface 103. The resin layer 92 fixes the ceramic capacitor 101 to the core board 11. The resin layer 92 is made of the same material as those of the resin insulating layers 33-36 and the resin cover layer 151 (i.e., epoxy resin which is a thermosetting resin). Thus, the resin layer 92 has the same thermal expansion coefficient value as those of the resin insulating layers 33-36 and the resin cover layer 151, more particularly, it is about 10-60 ppm/° C. (more specifically, 20 ppm/° C. or thereabout). The ceramic capacitor 101 has a generally square shape in the plane view, and each of its four corners is rounded with a radius of 0.55 mm or more (chamfered with a taper of 0.6 mm in this embodiment). As a result, when the resin layer 92 is deformed as a consequence of a temperature change, it is possible to alleviate the concentration of stress at the corner portions of the ceramic capacitor 101 whereby it is possible to prevent the occurrence of cracking in the resin layer 92.

As shown in FIG. 1, the electrodes 111, 112 provided on the capacitor main surface 102 are electrically connected to the IC chip 21 through the via conductors 47, the main surface side conductor layer 41, the via conductors 43, the terminal pads 44, the solder bumps 45 and the surface connection terminals 22 of the IC chip 21. On the other hand, the electrodes 121, 122 provided on the capacitor rear surface 103 are electrically connected to an electrode provided in a motherboard (not illustrated) through the protruding conductors 51, the via conductors 47, the rear surface side conductor layer 42, the via conductors 43, the PGA pads 48 and the solder bumps 49.

For example, when electric conduction is effected from the motherboard side through the electrode terminal 121, 122 to apply a voltage across the power supplying inner electrode layer 141 to the grounding inner electrode layer 142, positive charges, for example, are accumulated in the power supplying inner electrode layer 141, while negative charges, for example, are accumulated in the grounding inner electrode layer 142. As a result, the ceramic capacitor 101 functions as a capacitor. In addition, in the ceramic capacitor 101, the power supplying capacitor via conductor 131 and the grounding capacitor via conductor 132 are disposed adjacent to each other, so that the direction of current flowing through the power supplying via conductor 131 and the grounding via conductor 132 are opposite to each other. As a result, reduction in the inductance component is attained.

Next, the method for manufacturing the wiring board 10 according to this embodiment will be described.

In a core board preparation step, a semi-finished product of the core board 11 is produced by a conventionally known method, and is prepared in advance.

Figure 5:
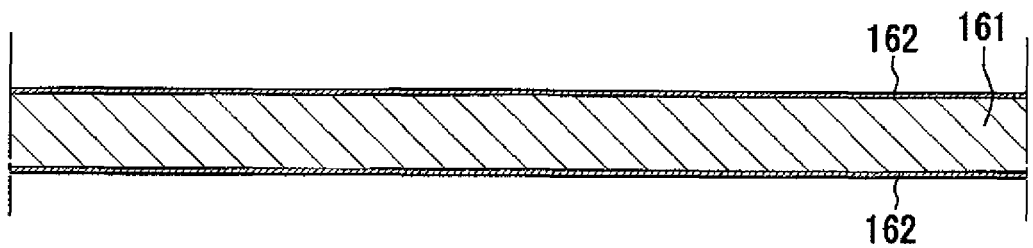
FIG. 5 is an explanatory view showing a method for manufacturing a wiring board.
Figure 6:
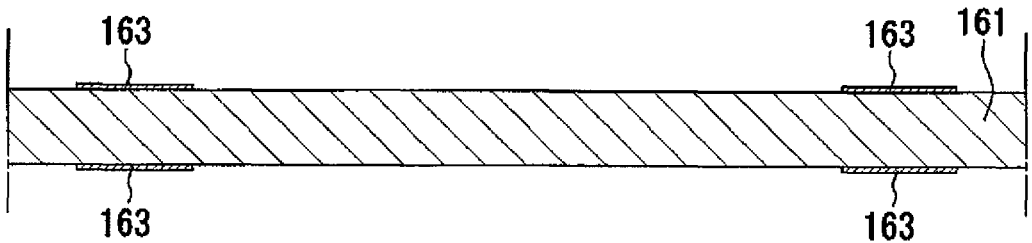
FIG. 6 is an explanatory view showing a method for manufacturing a wiring board.
Figure 7:
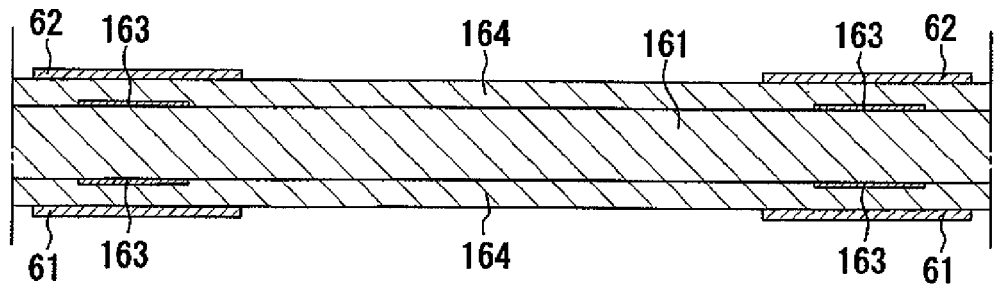
FIG. 7 is an explanatory view showing a method for manufacturing a wiring board.

The semi-finished product of the core board 11 is manufactured as follows. First, a copper coated plate in which a copper foil 162 is bonded to both surfaces of the substrate 161 with the size of 350 mm (longitudinal)×375 mm (lateral)×0.6 mm (thickness) is prepared (refer to FIG. 5). The conductor layer 163 is pattern printed using, for example, a subtractive method by etching the copper foil 162 on both surfaces of the copper coated plate (refer to FIG. 6). More particularly, after an electroless copper plating process, an electrolytic copper plating process is performed using the electroless copper plating layer as a common electrode. A dry film is laminated thereon and the dry film is formed in a predetermined pattern by exposing and developing the dry film. In this state, an unnecessary electrolytic copper plating layer, an unnecessary electroless copper plating layer and an unnecessary copper foil 162 are removed by etching. Thereafter, the dry film is peeled off. Next, after roughening the upper surface and the lower surface of the substrate 161 and the conductor layer 163, an epoxy resin film (80 μm in thickness) to which the inorganic filler is added is laminated by a thermocompression on the upper surface and the lower surface of the substrate 161, thereby producing the sub-substrate 164 (refer to FIG. 7).

Figure 8:
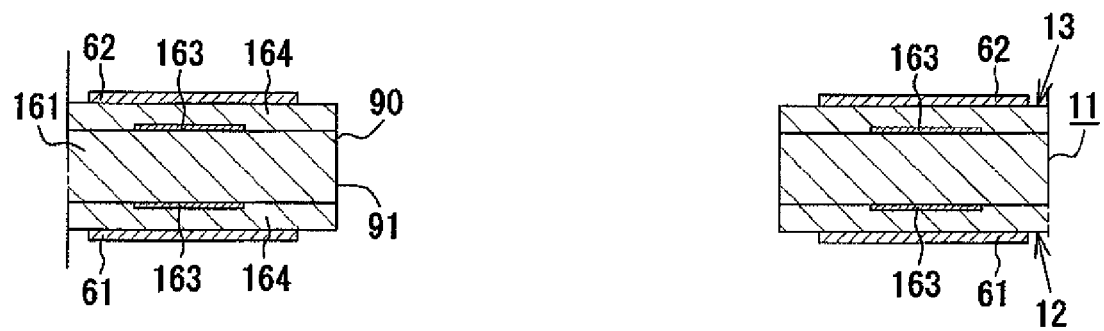
FIG. 8 is an explanatory view showing a method for manufacturing a wiring board.

Next, the core rear surface side conductor layer 62 (75 micrometers in thickness) is pattern printed on the upper surface of the upper sub-substrate 164 and the core main surface side conductor layer 61 (50 micrometers in thickness) is pattern printed on the lower surface of the lower sub-substrate 164, respectively. More particularly, after performing electroless copper plating to the upper surface of the upper sub-substrate 164 and the lower surface of the lower sub-substrate 164, etching resist is formed thereon, and thereafter, electrolytic copper plating is performed. Further, etching resist is removed and soft etching is performed. Then, a laminated body comprised of the substrate 161 and the sub-substrates 164 is subjected to a boring step using a router to form a through hole used as the accommodation hole 90 in a predetermined position. Thereby, the semi-finished product of the core board 11 is completed (see FIG. 8). It is noted that the semi-finished product of the core board 11 means a core board for producing a plurality of core boards 11 in which a plurality of regions serving later as the core boards 11 is disposed vertically and horizontally along the plane direction.

In a component preparation step (capacitor preparation step), the ceramic capacitor 101 having the protruding conductors 51 is produced by conventionally known method, and is prepared in advance.

The ceramic capacitor 101 is produced as follows. Ceramic green sheets are produced, and then nickel paste for inner electrode layers is screen-printed on the green sheets and is allowed to dry. In consequence, power supplying inner electrode portions and grounding inner electrode portions, which serve as the power supplying inner electrode layers 141 and the grounding inner electrode layers 142 later, respectively, are formed. Next, the green sheets each having the power supplying inner electrode portions formed thereon and the green sheet having the grounding inner electrode portions formed thereon are alternately laminated, and as a pressing force is imparted thereto in the laminated direction of the sheets, thereby integrating the green sheets and forming a green sheet laminated body.

Furthermore, a plurality of via holes 130 are formed in the green sheet laminated body using a laser processing machine, and nickel paste for via conductors is filled in each via hole 130 using a press-fitting and filling machine (not illustrated). Next, paste for forming electrodes is printed on the upper surface of the green sheet laminated body to form the rear surface side power supplying electrodes 121 and the rear surface side grounding electrodes 122 so as to cover the upper end face of each conductor portion at the upper side of the green sheet laminated body. Also, the paste is printed on the lower surface of the green sheet laminated body to form the main surface side power supplying electrodes 111 and the main surface side grounding electrodes 112 so as to cover the lower end face of each conductor portion at the lower side of the green sheet laminated body.

Subsequently, the green sheet laminated body is dried so that each electrode 111, 112, 121, 122 is solidified to some extent. Next, the green sheet laminated body is degreased and subjected to firing at a predetermined temperature for a predetermined time. As a result, barium titanate and nickel contained in the paste are simultaneously sintered, thereby forming the ceramic sintered body 104.

Next, the electroless copper plating (about 10 μm in thickness) is applied to each electrode 111, 112, 121, 122 of the ceramic sintered body 104. As a result, the copper plating layer is formed on each electrode 111, 112, 121, 122.

Figure 9:
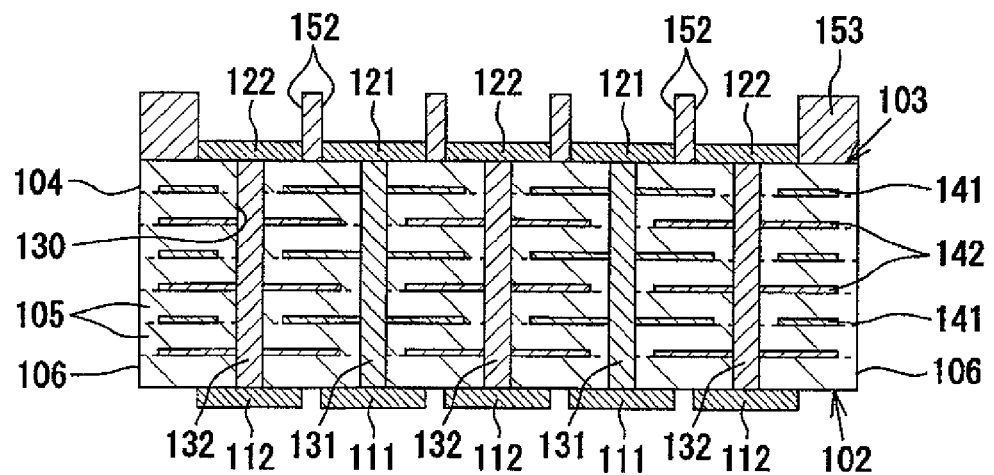
FIG. 9 is an explanatory view showing a method for manufacturing a wiring board.
Figure 10:
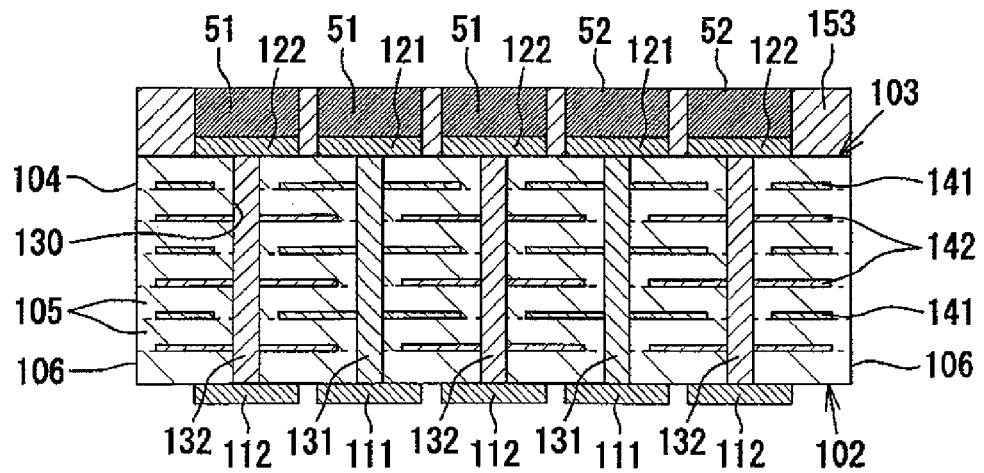
FIG. 10 is an explanatory view showing a method for manufacturing a wiring board.
Figure 11:
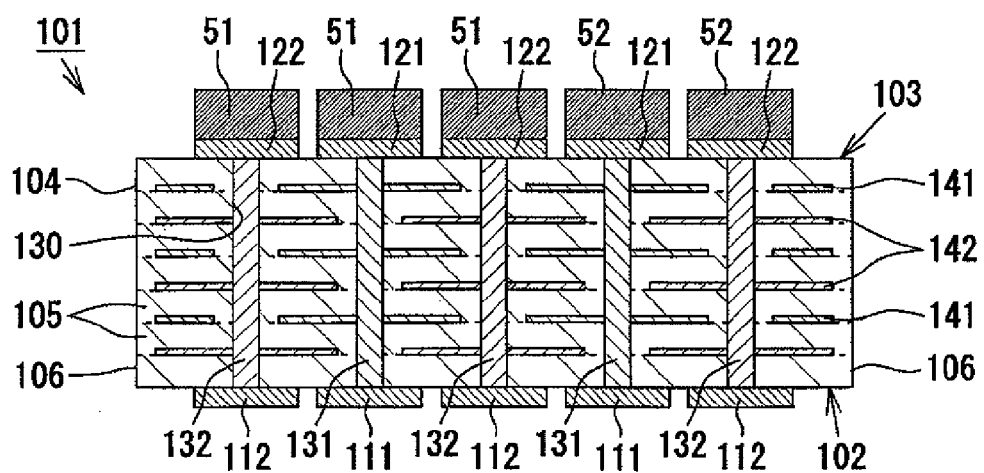
FIG. 11 is an explanatory view showing a method for manufacturing a wiring board.

Next, a dry film 153 is laminated on the capacitor rear surface 103 of the ceramic sintered body 104 and subjected to an exposure and a development so that the plurality of openings 152 where the whole surface of electrode 121, 122 is exposed is formed in the dry film 153 (refer to FIG. 9). These openings 152 are formed in the positions where the protruding conductors 51 are to be formed. The electrolytic copper plating is applied to inside of the openings 152 through the dry film 153 (refer to FIG. 10). Further, the dry film 153 is removed. As a result, the protruding conductors 51 are formed, respectively, on the rear surface side power supplying electrode 121 and the rear surface side grounding electrode 122 to thereby complete the ceramic capacitor 101 (refer to FIG. 11). Each protruding conductor 51 has a thickness of 190 micrometers or thereabout at this time which is such an extent that the protruding conductor 51 protrudes from the core rear surface 13 when the ceramic capacitor 101 is accommodated in the accommodation hole 90 (refer to FIGS. 15 to 17). It is noted that "190 micrometers or thereabout" defined in this embodiment is a minimum thickness for compensating the thickness variation of the core board 11 and that of the ceramic capacitor 101. By defining the thickness in this extent, the amount of surface grinding can be minimized in a height alignment step mentioned later. Consequently, the deterioration in productivity can be prevented in advance.

Figure 12:
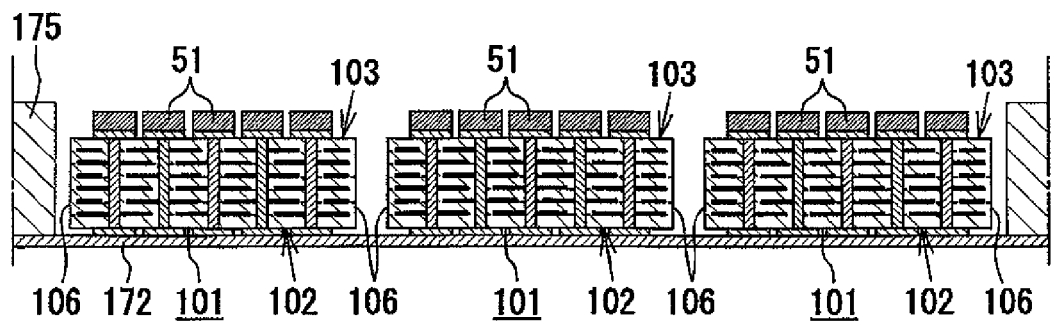
FIG. 12 is an explanatory view showing a method for manufacturing a wiring board.

After roughening the capacitor rear surface 103 of the completed ceramic capacitor 101, a plurality of ceramic capacitors 101 are set in a jig (not illustrated) using a mounting device (made by Yamaha Motor Co., Ltd.) with the capacitor rear surface 103 facing upward. More particularly, an exfoliable adhesive tape 172 is disposed on the jig, and the ceramic capacitors 101 is adhered and temporarily fixed to an adhesive face of the adhesive tape 172 (refer to FIG. 12). Further, a rectangular-shaped frame 175 is attached to the adhesive tape 172, and each ceramic capacitor 101 is disposed in the frame 175. At this time, each ceramic capacitor 101 is disposed in parallel with the adhesive face of the adhesive tape 172 and disposed apart from each other.

Figure 13:
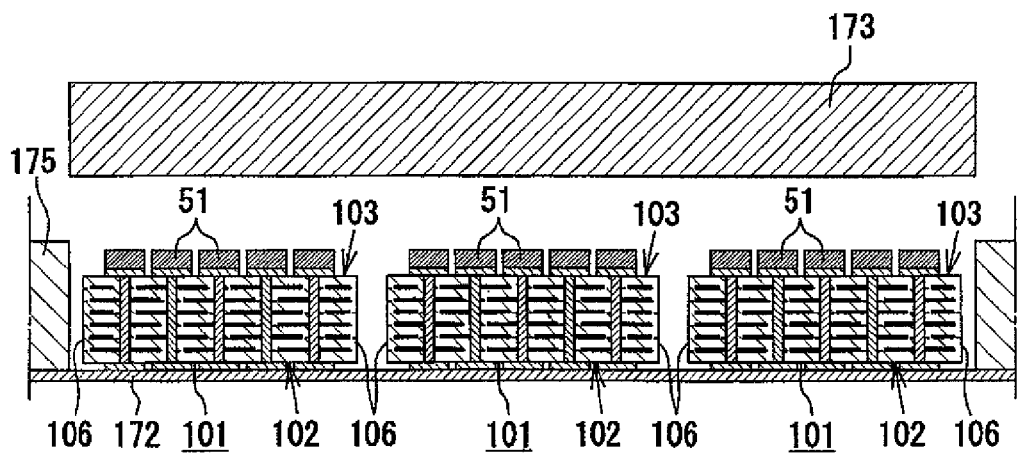
FIG. 13 is an explanatory view showing a method for manufacturing a wiring board.
Figure 14:
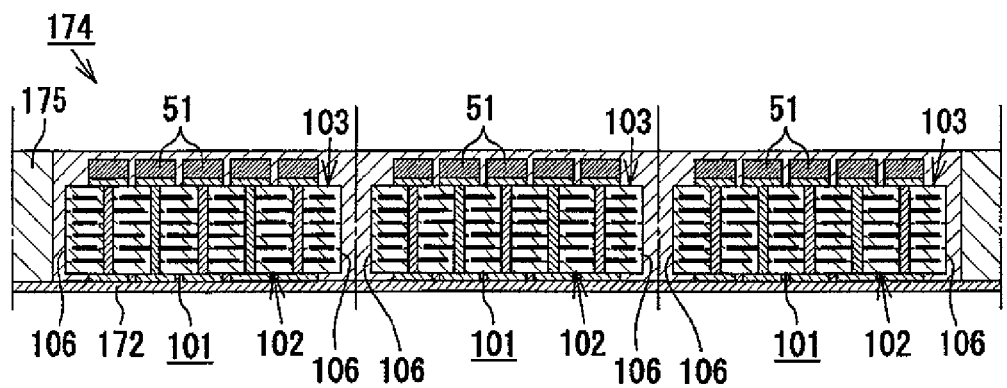
FIG. 14 is an explanatory view showing a method for manufacturing a wiring board.

In a subsequent resin cover layer forming step, an epoxy resin film 173 (400 micrometers in thickness) serving as a unhardened resin cover layer 151 is laminated on each ceramic capacitor 101 which is located in the jig (refer to FIGS. 13 and 14). At this time, a part of the epoxy resin film 173 is filled in a gap between the capacitor side faces 106 of the adjacently disposed ceramic capacitors 101, and a gap between the capacitor side face 106 and an inner wall face of the frame 175. Then, the epoxy resin film 173 is subjected to a heat treatment (curing process) and allowed to be hardened. At this time, a part of the hardened resin cover layer 151 (resin material) is disposed between the protruding conductors 51. The thus-formed article is a built-in capacitor aggregation for wiring board 174 in which a plurality of regions serving later as the ceramic capacitors 101, which includes the resin cover layer 151, is disposed vertically and horizontally in the plane direction. Next, score lines are formed along the outline (refer to dashed lines in FIG. 14) of a product field on a top surface and a rear surface of the built-in capacitor aggregation for wiring board 174 by a conventionally known blade device. Further, the built-in capacitor aggregation for wiring board 174 is divided into an individual single piece along the score lines. At this time, the ceramic capacitor 101 is cut so that each capacitor side face 106 has the 500 micrometers-thick resin cover layer 151. As a result, a plurality of ceramic capacitors 101 having the capacitor main surface 102, the capacitor rear surface 103 and the capacitor side face 106 all of which are covered by the resin cover layer 151 are simultaneously produced. Thereafter, the adhesive tape 172 is peeled off.

Figure 15:
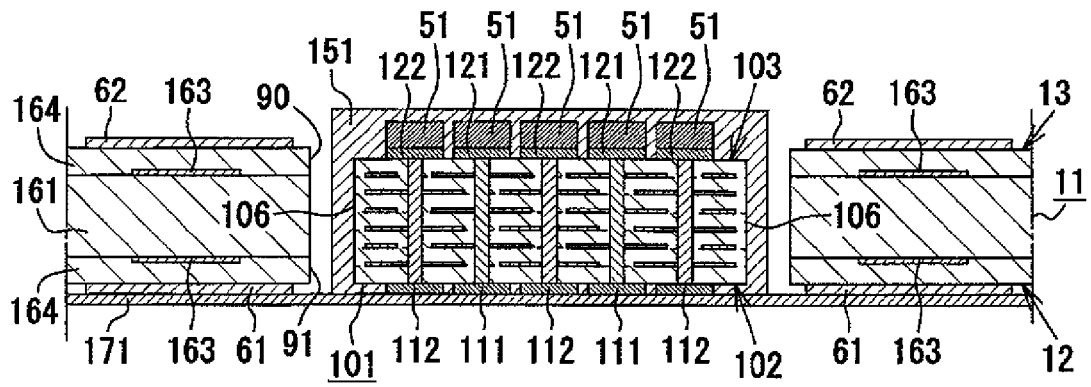
FIG. 15 is an explanatory view showing a method for manufacturing a wiring board.

In a subsequent accommodation step, the ceramic capacitors 101 is accommodated in the accommodation hole 90 using a mounting device (made by Yamaha Motor Co., Ltd.) with the capacitor rear surface 103 facing the same side as the core rear surface 13 (refer to FIG. 15). In this state, the surface of the top portion 52 of each protruding conductor 51 is located upward with respect to the surface of the core rear surface side conductor layer 62. The core main surface 12 side opening of the accommodation hole 90 is sealed by an exfoliable adhesive tape 171. The adhesive tape 171 is supported by a support table (not illustrated). The ceramic capacitor 101 is adhered and temporarily fixed to an adhesive face of the adhesive tape 171. Since the ceramic capacitor 101 is thinner than the core board 11, a level difference exists between the core rear surface 13 and the capacitor rear surface 103.

Figure 16:
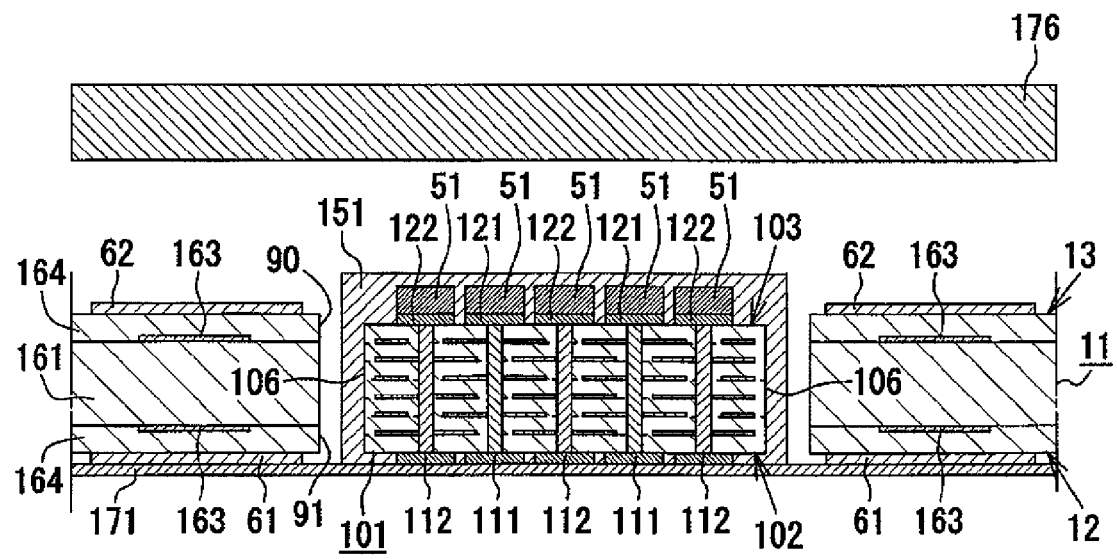
FIG. 16 is an explanatory view showing a method for manufacturing a wiring board.
Figure 17:
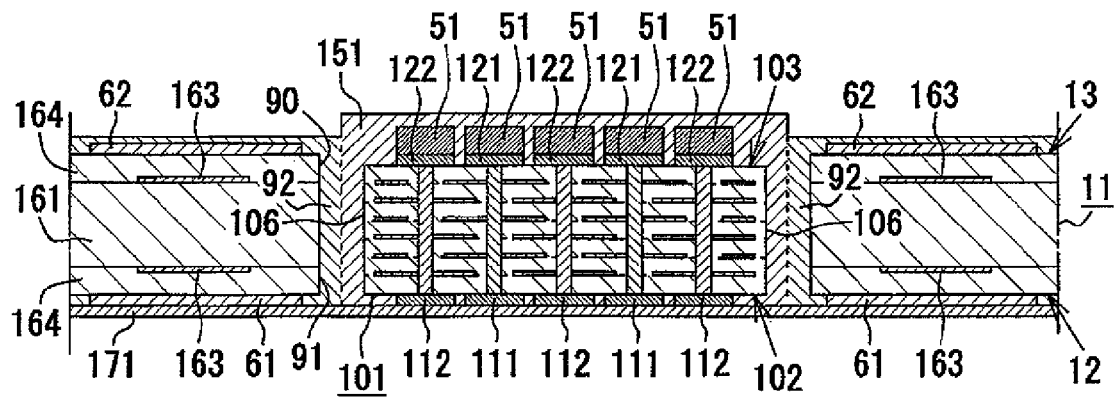
FIG. 17 is an explanatory view showing a method for manufacturing a wiring board.

In a subsequent resin layer forming step, a resin sheet 176 (200 micrometers in thickness) serving as an unhardened resin layer 92 is laminated on the core rear surface 13 and the capacitor rear surface 103 (refer to FIGS. 16 and 17). In addition, a part of resin layer 92 (resin sheet 176) is filled in a gap between the inner wall face 91 of the accommodation hole 90 and the surface of resin cover layer 151 covering the capacitor side face 106. In a subsequent fixation step, the resin layer 92 (resin sheet 176) is subjected to a heat treatment (curing process or the like) and allowed to be hardened so that the ceramic capacitor 101 is fixed to the core board 11.

Figure 18:
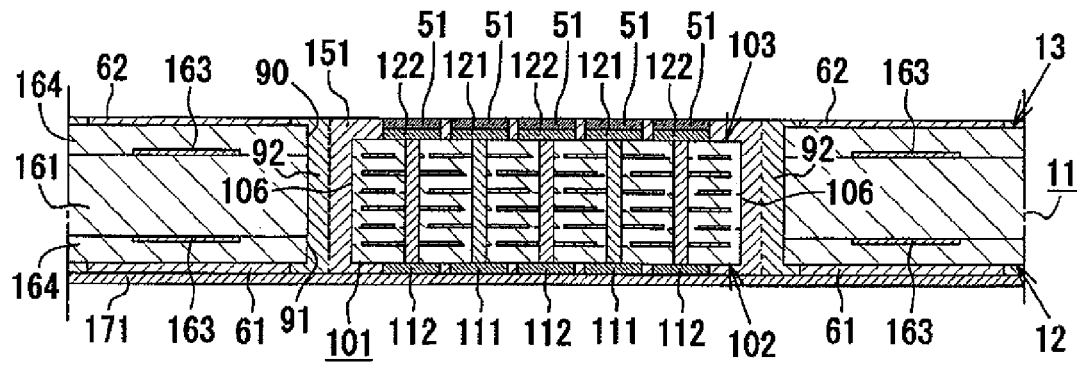
FIG. 18 is an explanatory view showing a method for manufacturing a wiring board.

In a subsequent height alignment step, the surface of the top portion 52 of each protruding conductor 51 and the surface of the core rear surface side conductor layer 62 are aligned at the same height (refer to FIG. 18). More particularly, using a belt sander device, while each protruding conductor 51 is made lower by grinding the surface of the top portion 52 that is positioned upward with respect to the surface of the core rear surface side conductor layer 62, the resin layer 92 and the resin cover layer 151 covering the capacitor rear surface 103 are also ground. Further, the surface of the core rear surface side conductor layer 62, which is exposed by grinding the resin layer 92, is also ground. As a result, a part of the top portion 52 and a part of the core rear surface side conductor layer 62 are mechanically removed, and the thickness of each protruding conductor 51 is set to be 100 micrometers and the thickness of the core rear surface side conductor layer 62 is set to be 65 micrometers. An arithmetic average coarseness Ra of a grinding surface of a sandpaper attached to the belt sander device is equal to an arithmetic average coarseness Ra of the ground surface of the core rear surface side conductor layer 62 and the ground surface of the top portion 52, more particularly, it is set to be 0.8 micrometer. Furthermore, the grinding time with the belt sander device is set to be 30 seconds. At this time, the adhesive tape 171 is exfoliated. Since the surface of the electrode 111, 112 and the surface of the core main surface side conductor layer 61 are in contact with the adhesive tape 171, they have the same height without grinding.

Figure 19:
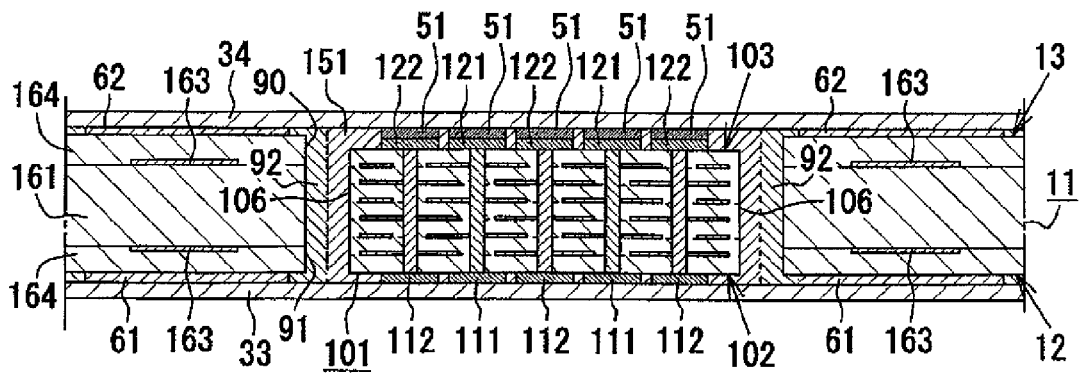
FIG. 19 is an explanatory view showing a method for manufacturing a wiring board.

Next, while forming the main surface side buildup layer 31 on the core main surface 12, the rear surface side buildup layer 32 is formed on the core rear surface 13 by a conventionally known method. More particularly, a photosensitive epoxy resin is coated on the core main surface 12 and the capacitor main surface 102, and exposure and development are performed, thereby forming the lowermost main surface side resin insulating layer 33 (refer to FIG. 19). Alternatively, an insulating resin or a liquid crystal polymer (LCP) may be used instead of the photosensitive epoxy resin.

Next, the rear surface side interlayer insulating layer forming step is carried out. A photosensitive epoxy resin is coated on the core rear surface 13 and the capacitor rear surface 103, and performing exposure and development, thereby forming the resin insulating layer 34 (refer to FIG. 19). Alternatively, an insulating resin or a liquid crystal polymer may be used instead of the photosensitive epoxy resin. Further, via holes 181, 182 are formed in the predetermined positions where the via conductors 47 are to be formed by laser drilling using a YAG laser or carbon dioxide laser (refer to FIG. 20). More particularly, the via holes 181 penetrating the core main surface side resin insulating layer 33 are formed so as to expose the main surface side power supplying electrodes 111 and the main surface side grounding electrodes 112. Also, the via holes 182 penetrating the rear surface side resin insulating layer 34 is formed so as to expose the surface of the top portion 52 of the protruding conductors 51 formed on the rear surface side power supplying electrode 121 and the surface of the top portion 52 of the protruding conductor 51 formed on the rear surface side grounding electrode 122 (via hole forming step).

Figure 20:
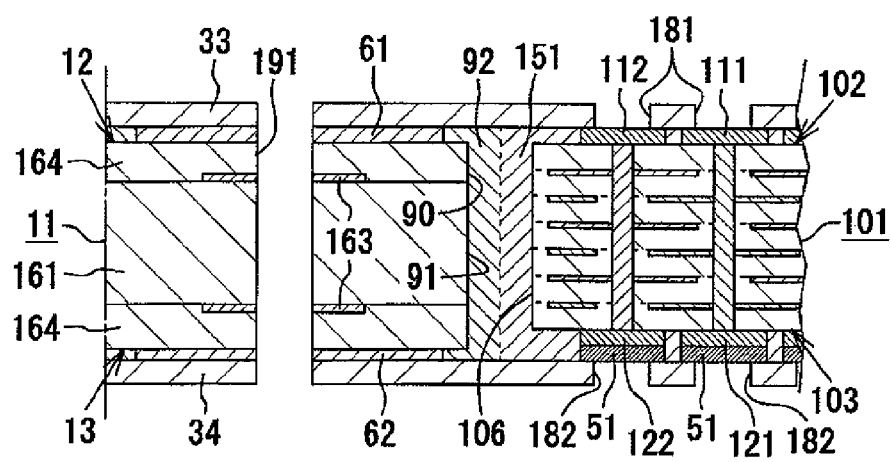
FIG. 20 is an explanatory view showing a method for manufacturing a wiring board.
Figure 21:
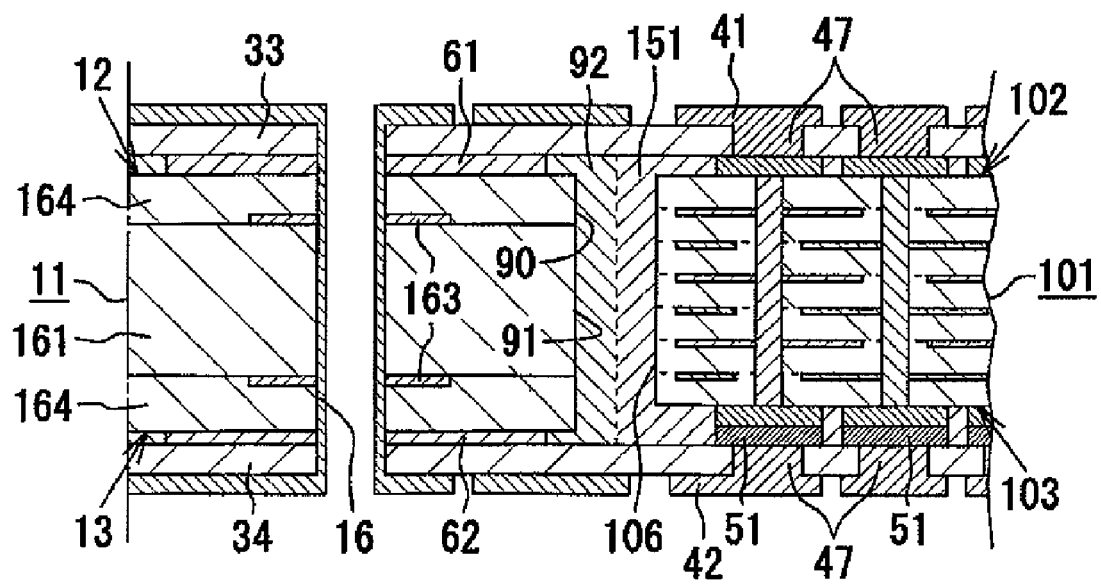
FIG. 21 is an explanatory view showing a method for manufacturing a wiring board.

Further, a boring step is performed using a drill machine to form a through hole 191 penetrating the core board 11 and the resin insulating layer 33, 34 in advance (refer to FIG. 20). After electroless copper plating is applied to the surface of the resin insulating layer 33, 34, an inner face of the via hole 181, 182 and an inner face of the through hole 191, etching resist is formed, and then electrolytic copper plating is performed. Etching resist is removed and soft etching is performed. As a result, while the main surface side conductor layer 41 is formed on the main surface side resin insulating layer 33, the rear surface side conductor layer 42 is formed on the rear surface side resin insulating layer 34 (refer to FIG. 21). At the same time, the through hole conductor 16 are formed in the through hole 191 and the via conductor 47 is formed inside of each via hole 181, 182 (via conductor forming step). Next, an insulating resin material (epoxy resin) is filled in the through hole conductors 16 to form a plugging body 17 (refer to FIG. 22).

Figure 22:
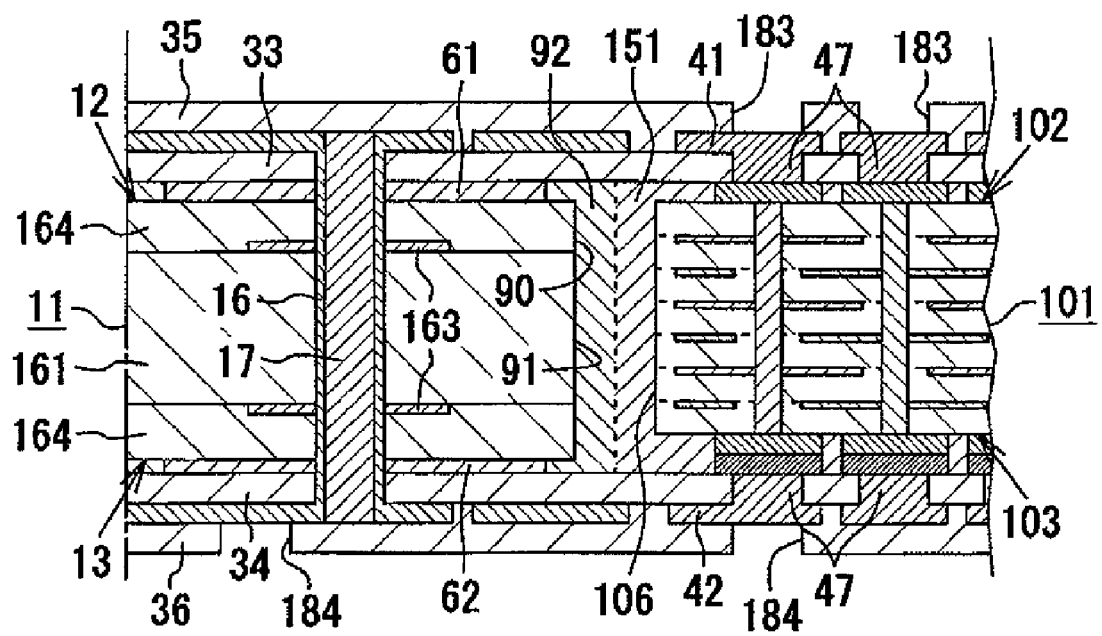
FIG. 22 is an explanatory view showing a method for manufacturing a wiring board.
Figure 23:
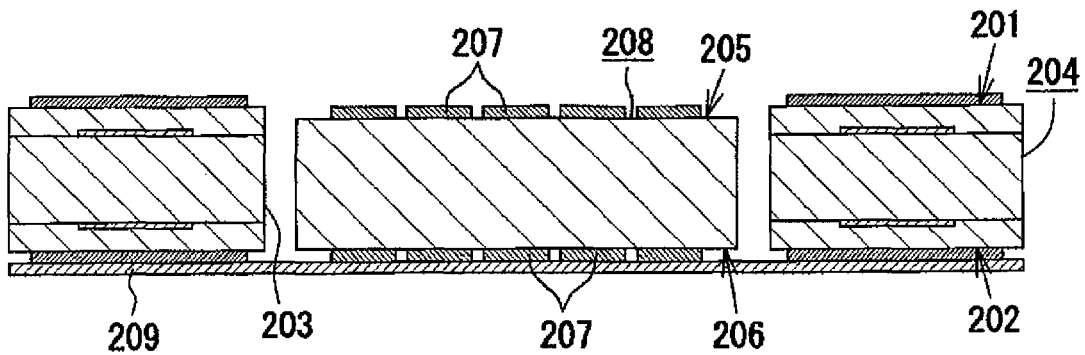
FIG. 23 is an explanatory view showing a method for manufacturing a wiring board according to a prior art method.
Figure 24:
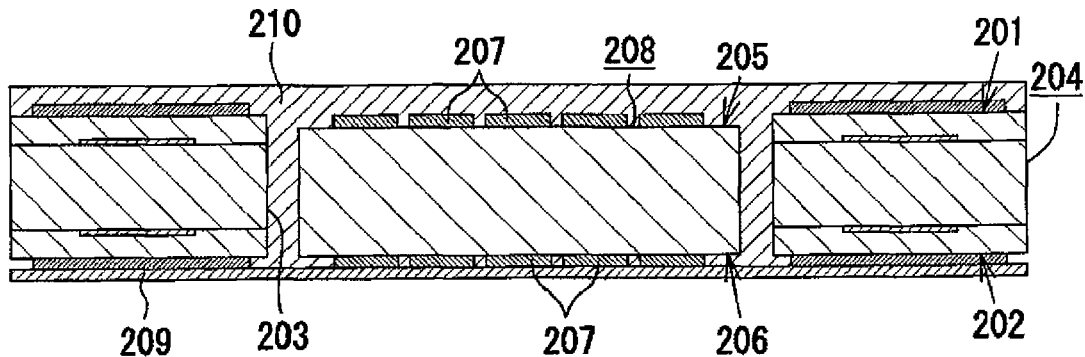
FIG. 24 is an explanatory view showing a method for manufacturing a wiring board according to a prior art method.
Figure 25:
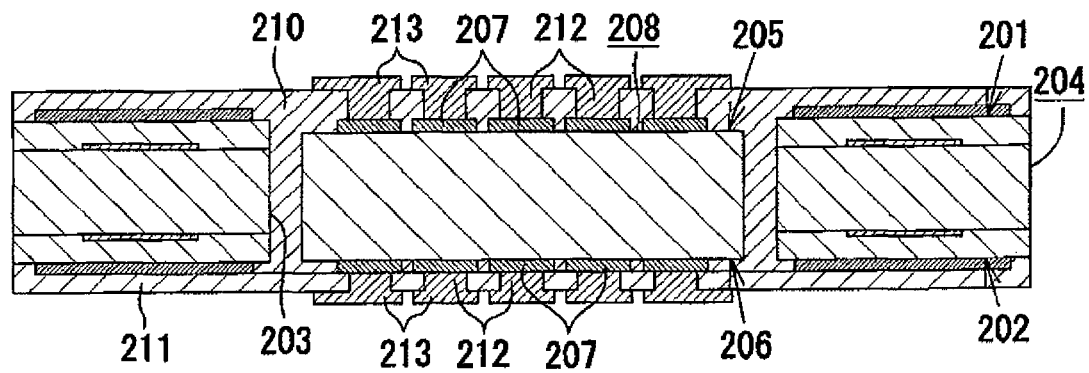
FIG. 25 is an explanatory view showing a method for manufacturing a wiring board according to a prior art method.

Next, the photosensitive epoxy resin is laminated on the resin insulating layers 33, 34, and the exposure and development are performed to form the resin insulating layers 35, 36 having via holes 183, 184 in the predetermined positions where the via conductors 43 are to be formed (refer to FIG. 22). Alternatively, an insulating resin or a liquid crystal polymer may be used instead of the photosensitive epoxy resin. In this case, via holes 183, 184 are formed in the predetermined positions where the via conductors 43 are to be formed by a laser processing machine. Then, the electrolytic copper plating is applied in accordance with a conventionally known method to form the via conductors 43 inside of the via holes 183, 184, as well as forming the terminal pads 44 on the core main surface side resin insulating layer 35, and the BGA pads 48 are formed on the rear surface side resin insulating layer 36.

Subsequently, the photosensitive epoxy resin is coated on the resin insulating layers 35, 36, and allowed to harden, thereby forming the solder resist 37, 38. Next, exposure and development are conducted while a predetermined mask is disposed on the solder resist 37, 38 to thereby pattern print the opening portions 40, 46 thereon. Further, the solder bumps 45 are formed on the terminal pads 44, respectively, and the solder bumps 49 are formed on the BGA pads 48. It is noted that an article in this state is a wiring board for producing a plurality of wiring boards 10 and in which a plurality of product regions serving later as the wiring boards 10 is disposed vertically and horizontally along the plan direction. Further, the wiring board for producing the plurality of wiring boards 10 is divided into single pieces, thereby simultaneously producing the plurality of wiring boards 10.

Therefore, according to this embodiment, it is possible to obtain the following advantages.

(1) According to the method for manufacturing the wiring board 10 of this embodiment, since the surface of the top portion 52 of the plurality of protruding conductors 51 and the surface of the core rear surface side conductor layer 62 formed on the core rear surface 13 are aligned in the same height in the height alignment step, the variation in thickness of the rear surface side resin insulating layer 34 is reduced. Therefore, even when the plurality of via holes 182 penetrating the rear surface side resin insulating layer 34 is formed in the via hole forming step, and even when the via conductor 47 is formed in each via hole 182 in the via conductor forming step, the via holes 182 have a depth with small variation. Therefore, when performing the laser boring step to the rear surface side resin insulating layer 34, the amount of laser output can be uniformly adjusted, thereby easily and reliably forming each via hole 182. Further, the via conductor 47 can be reliably formed in each via hole 182. As a result, since the electrical connection between the protruding conductor 51 and the via conductor 47 can be reliably provided, it is possible to prevent an occurrence of a defective product, thereby contributing to the wiring board 10 having excellent reliability.

(2) In the height alignment step according to the embodiment, the surface of the top portion 52 is ground in the state where the resin cover layer 151 covering the capacitor rear surface 103 is disposed between each protruding conductors 51. Therefore, since each protruding conductor 51 is fixed by the resin cover layer 151, it is possible to prevent damage to the protruding conductor 51 even when a large stress is exerted on the protruding conductor 51 in the height alignment step. Further, by disposing the resin cover layer 151 between the protruding conductors 51, a concave portion between the protruding conductors 51 is filled so as to be flat. Thus, it is unlikely any ground powders will remain between the protruding conductors 51 when grinding the surface of the top portion 52 or the resin cover layer 151.

(3) In this embodiment, by forming the resin layer 92, the core rear surface 13 of the core board 11 becomes flat and the height of the connection terminal portion 50 (i.e., BGA pads 48) formed on the surface of the rear surface side buildup layer 32 becomes uniform when the rear surface side buildup layer 32 is formed on the core rear surface 13. Therefore, the wiring board 10 can be reliably mounted on a motherboard whereby the reliability of the wiring board 10 is improved.

(4) In the height alignment step according to the embodiment, both the top portion 52 of the protruding conductor 51 and the core rear surface side conductor layer 62 are removed. Thus, not only the surface of the top portion 52 is flattened, but the surface of the core rear surface side conductor layer 62 exposed from the resin layer 92 is also flattened. Therefore, the rear surface side resin insulating layer 34 formed on the protruding conductor 51 or the core rear surface side conductor layer 62 has a small variation in thickness. Thus, when the plurality of via holes 182 are formed in the rear surface side resin insulating layer 34, the via holes 182 have a depth in small variation whereby the via conductor 47 can be further reliably formed in each via hole 182, and the electrical connection between the protruding conductor 51 and the via conductor 47 can be further reliably provided. As a result, the wiring board 10 having further excellent reliability can be produced.

(5) In this embodiment, the ceramic capacitor 101 is disposed immediately below the IC chip 21 mounted on the IC chip mounting region 23, the distance of the wiring connecting the ceramic capacitor 101 to the IC chip 21 becomes short, thereby achieving the reduction in the inductance component. Therefore, the switching noise of the IC chip 21 caused by the ceramic capacitor 101 can be reduced, and the power supply voltage can be stabilized. Further, the noise invading between the IC chip 21 and the ceramic capacitor 101 can be substantially reduced. As a result, any defects, such as malfunctions, are unlikely to occur and high reliability of the wiring board 10 can be achieved.

(6) Further, in this embodiment, the IC chip mounting region 23 is disposed in a region right above the ceramic capacitor 101, the IC chip 21 mounted on the IC chip mounting region 23 is supported by the ceramic capacitor 101 having high rigidity and a small coefficient of thermal expansion. Since the first buildup layer 31 is unlikely to deform in the IC chip mounting region 23, the ceramic capacitor 101 can securely support the IC chip 21 mounted on the IC chip mounting region 23. Thus, any crack or connection failure of the IC chip 21 due to a large thermal stress applied thereto can be prevented. Therefore, a large IC chip with the size of over 10 nm×10 mm and a fragile IC chip with low-k (low dielectric constant) can be used as the IC chip 21. The large IC chip is likely to deform due to a difference in thermal expansion with a wiring board and likely to exert heat stress onto the wiring board. Further, the large IC chip produces large calorific power at the time of use, thereby imposing heat shock on the wiring board.

The embodiment may be modified as follows.

The protruding conductor 51 according to the above-mentioned embodiment is a conductor (copper post) made by copper plating. However, it may be, for example, a conductor formed by printing a copper paste.

According to the above-mentioned embodiment, the protruding conductors 51 are disposed on the electrodes 121, 122 formed on the capacitor rear surface 103 of the ceramic sintered body 104. However, the protruding conductors 51 may be disposed on the electrodes 111, 112 formed on the capacitor main surface 102. In this way, the protruding conductors 51 can securely connect not only the electrodes 121, 122 to the via conductors 47 formed in the rear surface side resin insulating layer 34, but also connect the electrodes 111, 112 to the via conductors 47 formed in the main surface side resin insulating layer 33. As a result, the wiring board 10 having further excellent reliability can be produced. However, in light of the manufacturing cost reduction in the wiring board 10, the protruding conductors 51 are preferably formed only on the electrodes 121, 122, rather than forming on the electrodes 111, 112 which are the same height as the core main surface side conductor layer 61.

In the above-mentioned embodiment, the resin layer forming step for forming the resin layer 92 on the core rear surface 13 and the capacitor rear surface 103 is conducted while the resin cover layer forming step for forming the resin cover layer 151 on the ceramic capacitor 101 is conducted. However, either the resin cover layer forming step or the resin layer forming step may be omitted. When the resin cover layer forming step is omitted, the surface of the top portion 52 is ground in the height alignment step in a state where the hardened resin layer 92 is disposed between the protruding conductors 51. On the other hand, when the resin layer forming step is omitted, the resin cover layer 151 covering the capacitor side face 106 is preferably formed to be thicker than the above-mentioned case (e.g., 900 micrometers or thereabout).

In the above-mentioned embodiment, a part of resin layer 92 formed separately from the main surface side buildup layer 31 fills the gap between the inner wall face 91 of the accommodation hole 90 and the surface of the resin cover layer 151 covering the capacitor side face 106. However, a part of rear surface side resin insulating layer 34 constituting the rear surface side buildup layer 32 may fill the gap between the inner wall face 91 of the accommodation hole 90 and the surface of the resin cover layer 151 covering the capacitor side face 106. In this way, since the resin layer forming step is not required, the manpower for producing the wiring board 10 can be reduced, thereby contributing to an easy and cost-effective manufacturing of the wiring board 10.

In the above-mentioned embodiment, the BGA pads 48 connectable to a motherboard and the solder bumps 49 are formed on the surface of the rear surface side buildup layer 32 while the IC chip 21 is mounted on the IC chip mounting region 23 formed in the surface 39 of the main surface side buildup layer 31. However, for example, the BGA pads 48 connectable to a motherboard and the solder bumps 49 may be formed on the surface 39 of the main surface side buildup layer 31 while the IC chip 21 may be mounted on the IC chip mounting region 23 formed in a surface of the rear surface side buildup layer 32. In this case, when comparing the electrodes 121, 122 located at the IC chip mounting side to the electrodes 111, 112 located at the motherboard connection side, the former is substantially thicker than the latter by the thickness of the protruding conductors 51. Therefore, the conductor portions of the ceramic capacitor 101 to be electrically connected to the IC chip 21 can have low resistance.

The IC chip 21 may also be mounted on both the surface 39 of the main surface side buildup layer 31 and the surface of the rear surface side buildup layer 32.

Other modifications and alterations will occur to others upon their reading and understanding of the specification. It is intended that all such modifications and alterations be included insofar as they come within the scope of the invention as claimed or the equivalents thereof.

Having described the invention, the following is claimed:

1. A wiring board with built-in component, comprising:
   a core board including a core main surface, a core rear surface and an accommodation hole being open at least at the core rear surface, wherein a core main surface side conductor layer is formed on the core main surface, and a core rear surface side conductor layer is formed on the core rear surface;
   a component comprised of: a component main body including a component main surface, a component rear surface and a component side face; and a plurality of protruding conductors formed on the component rear surface in a protruding manner, wherein the component is accommodated in the accommodation hole with the core rear surface facing the same side as the component rear surface;
   a main surface side laminated wiring portion having a laminated structure in which a main surface side interlayer insulating layer and a main surface side conductor layer are laminated on the core main surface, and providing an integrated circuit element mounting region for mounting an integrated circuit element on a surface thereof; and
   a rear surface side laminated wiring portion having a laminated structure in which a rear surface side interlayer insulating layer and a rear surface side conductor layer are laminated on the core rear surface, and providing a connection terminal portion, which is connectable to a motherboard, on a surface thereof,
   wherein a surface of the core rear surface side conductor layer and a surface of a top portion of the plurality of protruding conductors are aligned in the same plane,
   wherein an arithmetic average coarseness of the surface of the core rear surface side conductor layer and the surface of the top portion is rougher than an arithmetic average coarseness of a surface of the core main surface side conductor layer, and
   wherein the core rear surface side conductor layer is thinner than the core main surface side conductor layer.

2. A wiring board with built-in component according to claim 1, wherein the rear surface side interlayer insulating layer located nearest to the core rear surface has a thickness variation of 5 micrometers or less and includes a via conductor therein.

3. A wiring board with built-in component, comprising:
   a core board including a core main surface, a core rear surface and an accommodation hole being open at least at the core rear surface, wherein a core main surface side conductor layer is formed on the core main surface, and a core rear surface side conductor layer is formed on the core rear surface;
   a component comprised of: a component main body including a component main surface, a component rear surface and a component side face; and a plurality of protruding conductors formed on the component rear surface in a protruding manner, wherein the component is accommodated in the accommodation hole with the core rear surface facing the same side as the component rear surface;
   a rear surface side laminated wiring portion having a laminated structure in which a rear surface side interlayer insulating layer and a rear surface side conductor layer are laminated on the core rear surface, and providing an integrated circuit element mounting region for mounting an integrated circuit element on a surface thereof; and
   a main surface side laminated wiring portion having a laminated structure in which a main surface side interlayer insulating layer and a main surface side conductor layer are laminated on the core main surface, and providing a connection terminal portion, which is connectable to a motherboard, on a surface thereof,
   wherein a surface of the core rear surface side conductor layer and a surface of a top portion of the plurality of protruding conductors are aligned in the same plane,
   wherein an arithmetic average coarseness of the surface of the core rear surface side conductor layer and the surface of the top portion is rougher than an arithmetic average coarseness of a surface of the core main surface side conductor layer, and
   wherein the core rear surface side conductor layer is thinner than the core main surface side conductor layer.

4. A wiring board with built-in component according to claim 3, wherein the rear surface side interlayer insulating layer located nearest to the core rear surface has a thickness variation of 5 micrometers or less and includes a via conductor therein.

* * * * *